(12) United States Patent
Mirkin et al.

(10) Patent No.: US 8,080,314 B2
(45) Date of Patent: Dec. 20, 2011

(54) NANOTUBE ASSEMBLY

(75) Inventors: Chad A. Mirkin, Evanston, IL (US);
Yuhuang Wang, Evanston, IL (US);
Daniel Maspoch, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 13/102,962

(22) Filed: May 6, 2011

(65) Prior Publication Data

US 2011/0212300 A1   Sep. 1, 2011

Related U.S. Application Data

(62) Division of application No. 11/633,095, filed on Dec. 4, 2006, now Pat. No. 7,959,974.

(60) Provisional application No. 60/741,837, filed on Dec. 2, 2005.

(51) Int. Cl.
*B32B 27/04* (2006.01)

(52) U.S. Cl. ............ 428/300.1; 977/742; 977/842; 977/845; 977/938; 427/77; 427/256; 427/331; 445/49; 445/50; 445/51; 430/315; 430/396; 264/5; 264/29.1; 264/81; 264/319; 428/357; 428/375; 428/378; 428/395

(58) Field of Classification Search ............... 428/300.1, 428/357, 375, 378, 395; 977/742, 842, 845, 977/938; 427/77, 256, 331; 445/49, 50, 445/51; 430/315, 396; 264/5, 29.1, 81, 319
See application file for complete search history.

(56) References Cited

U.S. PATENT DOCUMENTS

| | | |
|---|---|---|
| 6,827,979 B2 | 12/2004 | Mirkin et al. |
| 2002/0063212 A1 | 5/2002 | Mirkin et al. |
| 2003/0022470 A1 | 1/2003 | Liu et al. |
| 2004/0101469 A1 | 5/2004 | Demers |
| 2004/0166233 A1 | 8/2004 | Hong |
| 2004/0245209 A1 | 12/2004 | Jung et al. |
| 2005/0269285 A1 | 12/2005 | Jung et al. |
| 2006/0115640 A1 | 6/2006 | Yodh et al. |

FOREIGN PATENT DOCUMENTS

WO   WO 2004/049403 A   6/2004

OTHER PUBLICATIONS

Adleman, L. M., "Molecular Computation of Solutions to Combinatorial Problems", Science, vol. 266, pp. 1021-1024 (1994).
Ajayan, P.M., "Nanotubes from Carbon", *Nanotubes from Carbon*, Chemical Review, vol. 99, No. 7, pp. 1787-1800 (1999).

(Continued)

*Primary Examiner* — Michael Cleveland
*Assistant Examiner* — Xiao Zhao
(74) *Attorney, Agent, or Firm* — Foley & Lardner LLP

(57) ABSTRACT

Methods and articles providing for precise aligning, positioning, shaping, and linking of nanotubes and carbon nanotubes. An article comprising: a solid surface comprising at least two different surface regions including: a first surface region which comprises an outer boundary and which is adapted for carbon nanotube adsorption, and a second surface region which is adapted for preventing carbon nanotube adsorption, the second region forming an interface with the outer boundary of the first region, at least one carbon nanotube which is at least partially selectively adsorbed at the interface. The shape and size of the patterns on the surface and the length of the carbon nanotube can be controlled to provide for selective interfacial adsorption.

20 Claims, 13 Drawing Sheets

OTHER PUBLICATIONS

Auvray, S., et al., "Chemical Optimization of Self-Aseembled Caron Nanotube Transistors", *Nano Lett.* vol. 5, No. 3, pp. 451-455 (2005).
Avouris, P., "Molecular Electronics with Carbon Nanotubes", *Acc. Chem. Res.* vol. 35, pp. 1026-1034 (2002).
Baughman, R. H., et al, "Carbon Nanotubes—the Route Toward Applications", Science, vol., 297, pp. 787-792 (2002).
Braich, R. S., et al., "Solution of a 20-Variable 3-SAT Problem on a DNA Computer", Science, vol. 296, pp. 499-502 (2002).
Burggraf, S. ct al., "A pivotal Archaca group", Nature, vol. 385, pp. 780-781 (1997).
Che, J., et al., "Studies of fullerenes and arbon nanotubes by an extended bond order potential", Nanotechnology, vol. 10, pp. 263-268 (1999).
Collins, P. G., et al., "Engineering Carbon Nanotubes and Nanotube Circuits Using Electrical Breakdown", *Science*, vol. 292, pp. 706-709 (2001).
Cornell, W. D., et al., "A Second Generation Force Field for the Simulation of Proteins, Nucleic Acids, and organic Molecules", *J. Am. Chem. Soc.* vol. 117, pp. 5179-5197 (1195).
Dai, H.J., "Carbon nanotubes: opportunities and challenges", *Carbon Nanotubes, Opportunities and Challenges*, Surface Science, vol. 500, No. 1-3, p. 218-241 (2002).
Demers, L. M., et al. "Combinatorial Templates Generated by Dip-Pen Nanolithography for the Formation of Two-Dimensional Particle Arrays", Angew Chem. Int. Ed. Engl., vol. 40, No. 16, pp. 3069-3071 (2001).
Demers, L. M., et al. "Orthogonal Assembly of Nanoparticle Building Blocks on Dip-Pen Nanolithographically Generated Templates of DNA", Angew Chem. Int. Ed. Engl., vol. 40, No. 16, pp. 3071-3073 (2001).
Dresselhaus et al., "Carbon nanotubes roll on", Springer-Verlag, . See also, Special-Section, "Carbon Nanotubes" Physics World, vol. 13, pp. 29-53, 2000.
Duan, X., et al., "Nano-Welding by Scanning Probe Microscope", *J. Am. Chem. Soc.* vol. 127, pp. 8268-8269 (2005).
Falvo, M. R., et al., "Bending and buckling of carbon nanotubes under large strain", *Nature* vol. 389, pp. 581-584 (1997).
Gao, J., et al., "Large-Scale Fabrication of Aligned Single-Walled Carbon nanotube Array and Hierarchical Single-Walled Carbon Nanotube Assembly", *J. Am. Chem. Soc.* vol. 126, pp. 16698-16699 (2004).
Gao, H., et al., "Simulation of DNA-Nanotube Interactions", Annu. Rev. Mater. Res., vol. 34,pp. 123-150 (2004).
Gates, B. D., et al., "New Approaches to Nanofabrication: Molding, Printing, and Other Techniques", *Chem. Rev.* vol. 105, pp. 1171-1196 (2005).
Ginger, D. S., et al., "The Evolution of Dip-Pen Nanolithography" *Angew, Chem. Int. Ed.* vol. 43, pp. 30-35 (2004).
Girifalco, L. A., et al., "Carbon nanotubes buckyballs, ropes, and a universal graphitic potential", *Phys. Rev. B*, vol. 62, No. 19, pp. 13 104-13 110 (2000).
Goldiiaber-Gordon, D., et al., "Overview of Nanoelectronic Devices", Proceedings of the IEEE, vol. 85, No. 4, pp. 521-540 (1997).
Hampton, J. R., et al., "Transport rates vary with deposition time in dip-pen nanolithography", J. Phys. Chem. B. ACS, vol. 10, No. 49, pp. 23118-23120 (2005).
Heath, J. R., et al., "Molecular Electronics", Physics Today, pp. 43-49 (May 2003).
Hong, J-M., et al., "Selectively-Permeable Ultrathin Film Composite Memberanes Based on Molecularly-Imprinted Polymers", *Chem. Mater.* vol. 10, pp. 1029-1033 (1998).
Hong, S., et al., "A New Tool for Studying the in Situ Growth Processes for Self-Assembled Monolayers under Ambient Conditions", *Langmuir* vol. 15, pp. 7897-7900 (1999).
Huang, Y., et al., "Directed Assembly of One-Dimensional Nanostructures into Functional Networks", *Science* vol. 291, pp. 630-633 (2001).
Hummer, G., et al., "Water conduction through the hydrophobic channel of a carbon nanotube", Nature, vol. 414, pp. 188-190 (2001).
Ivanisevic, A. et al., "Redox-Controlled Orthogonal Assembly of Charged Nanostructures", J. Am. Chem. Soc., vol. 123, pp. 12424-12425 (2001).
Javey, A., et al.,"Ten- to 50-nm-long quasi-ballistic carbon nanotube devices obtained without complex lithography", *Proc. Nat. Acad. Sci. U.S.A.* vol. 101, pp. 13408-13410 (2004).
Jenekhe, S. A., et al., "Self-Assembly of Ordered Microporous Materials from Rod-Coil Block Copolymers", Science, vol. 283, pp. 372-375 (1999).
Johnson, C. R., "Coating lets nanotube transistors self-assemble on chips", EE Times, pp. 1-2 (2006).
Keren, K., et al., "DNA-Templated Carbon Nanotube Field-Effect Transister", *Science* vol. 302, pp. 1380-1382 (2003).
Kim, Y., et al., "Langmuir-Blodgett Films of Single-Wall Carbon nanotubes: Layer-by-layer Deposition and In-plane Orientation of Tubes", *Jap. J. Appl. Phys. Part 1* vol. 42, pp. 7629-7634 (2003).
Ko, H., et al., "Carbon Nanotube Arrays Encapsulated into Freely Suspended Flexible Films", *Chem. Mater.* vol. 17, pp. 2490-2493 (2005).
Kocabas, C., et al. , "Aligned Arrays of Single-Walled Carbon Nanotubes Generated from Random Networks by Orientationally Selective Laser Ablation, Tubes" *Nano Lett.* vol. 4, No. 12, pp. 2421-2426 (2004).
Kong, J., et al., "Nanotube Molecular Wires as Chemical Sensors", *Science* vol. 287, pp. 622-625 (2000).
Larsen, N. B., et al., "Order in Microcontact Printed Self-Assembled Monolayers", *J. Am. Chem. Soc.* vol. 119, pp. 3017-3026 (1997).
Lay, M. D., et al., "Simple route to Large-Scale Ordered Arrays of Liquid-Deposited Caron Nanotubes", *Nano Lett.* vol. 4, No. 4, pp. 603-606 (2004).
Lee, N. S., et al., "Application of carbon nanotubes to field emission displays" *Diamond & Related Materials*, vol. 10, pp. 265-270 (2001).
Liang, F., et al., "A Convenient Route to Functionalized Carbon Nanotubes", *Nano Lett.* vol. 4, No. 7, pp. 1257-1260 (2004).
Liu, J., et al. "A pivotal Archaea group" *Nature* vol. 385, pp. 780-781 (1997).
Liu, J., et al., "Controlled deposition of individual single-walled carbon nanotubes on chemically functionalized templates" *Chem. Phys. Lett.* vol. 303, pp. 125-129 (1999).
Lu, G., et al., "Carbon Nanotube Interaction with DNA", Nano Lett., vol. 5, No. 5, pp. 897-900 (2005).
Lu, J. P., "Elastic Properties of Carbon Nanotubes and Nanoropes", Phys. Rev. Lett., vol. 79, No. 7, pp. 1297-1300 (1997).
Madou, M., *Fundamentals of Microfabrication*, The Science of Miniaturization, 2nd Ed., pp. 454-455 (2002).
Martel, R., et al., "Rings of single-walled carbon nanotubes", Nature, vol. 398, pp. 299-300 (1999).
Mateiu, R., et al., "Building a multi-walled carbon nanotube-based mass sensor with the atomic force microscope", Ultramicroscopy, vol. 105, No. 1-4, pp. 233-237 (2005).
Meitl, M. A., et al., "Solution Casting and Transfer Printing Single-Waled Carbon Nanotube Films", *Nano Lett.* vol. 4, pp. 1643-1647 (2004).
Minot, E. D., et al., "Tuning Carbon Nanotube Band Gaps with Strain", *Phys. Rev. Lett.* vol. 90, pp. 156401-156404 (2003).
*Molecular Nanoelectronics*, Edited by: Reed & Lee, American Scientific Publishers (2003).
Nitzan, A., et al., "Electron Transport in Molecular Wire Junctions", Science, vol. 300, pp. 1384-1389 (2003).
O'Connell et al., "Reversible water-solubilization of single-walled carbon nanotubes by polymer wrapping." *Chemical Physics Letters*, vol. 342, pp. 265-271 (2001).
O'Connell et al., "Band gap fluorescence from individual single-walled carbon nanotubes", Science, vol. 297, No. 5581, pp. 593-596 (2002).
Pale-Grosdemange, C., et al., "Formation of Self-Assembled Monolayers by Chemisorption of Derivatives of Oligo(ethylene glycol) of Structure $HS(CH_2)_{11}(OCH_2CH_2)_mOH$ on Gold", *J. Am. Chem. Soc.*, vol. 113, pp. 12-20 (1991).
Percec, V., et al., "Self-organization of supramolecular helical dendrimers into complex electronic materials", Nature, vol. 419, pp. 384-387 (2002).

Piner, R. D., et al., "'Dip-Pen' Nanolithography", *Science*, vol. 283, pp. 661-663 (1999).
Postma, H. W., et al., Carbon nanotube Single-Electron Transistor at Room Temperature, *Science*, vol. 293, pp. 76-79 (2001).
Rao, S. G., et al., "Large-scale assembly of carbon nanotubes", Nature, vol. 425, pp. 36-37 (2003).
Rozhok, S., et al., "Dip-pen nanolithography: what controls ink transport?", J. Phys. Chem. B ACS, vol. 107, No., pp. 751-757 (2003).
Rueckes, T., et al., "Carbon Nanotube-Based Nonvolatile Random Access Memory for Molecular Computing", *Science*, vol. 289, pp. 94-97 (2000).
Salaita, K., et al., "Sub-100nm, Centimeter-Scale, Parallel Dip-Pen Naolithography", *Small* vol. 1, pp. 940-945 (2005).
Sano, M., et al., "Ring Closure of Carbon Nanotubes", Science, vol. 293, pp. 1299-1301 (2001).
Seeman, N. C., "DNA in a material world", Nature, vol. 42, pp. 427-431 (2003).
Service, R. F., "How Far Can We Push Chemical Self-Assembly", Science, vol. 309, p. 95 (2005).
Shea, H. R., et al., "Electrical Transport in Rings of Single-Wall Nanotubes: One-Dimensional Localization", Phys. Rev. Lett., vol. 84, No. 19, pp. 4441-4444 (2000).
Shvartzman-Cohen, R., et al., "Selective Dispersion of Single-Walled Carbon Nanotubes in the presence of Polymers: the Role of Molecular and Colloidal Length Scales", *J. Am. Chem. Soc.* vol. 126, 14850-14857 (2004).
Song, L., et al., "Large-Scale Synthesis of Rings of Bundled Single-Walled Carbon Nanotubes by Floating Chemical Vapor Deposition", Adv. Mater., vol. 18, pp. 1817-1821 (2006).
Snow, E. S., et al., "Chemical Detection with a Single-Walled Carbon Nanotube Capacitor", *Science* vol. 307, 1942-1945 (2005).
Tamura, R., et al., "Positive magnetic susceptibility in polygonal nanotube tori", *Phys. Rev. B* vol. 71, pp. 0454181-0454187 (2005).
Tersoff, J., et al., "Structural Properties of a Carbon-Nanotube Crystal", Phys. Rev. Lett., vol. 73, No. 5, pp. 676-679 (1994).
*The Chemistry of Nanostructured Materials*, ed. Peidong Yang, including Chapter 4, CVD Synthesis of Single Walled Carbon Nanotubes, p. 101-126, (2003).
Tsukruk, V. V., et al., Nanotube Surface Arrays: Weaving, Bending, and Assembling on Patterned Silicon, Phys. Rev. Lett., vol. 92, No. 6, pp. 065502-1-065502-4 (2004).
Valentin, E., et al., "Self-Asssembly Fabrication of High Performance Carbon Nanotubes Based FETS", Maters. Res. Soc. Symposium Proceedings, Maters. Res. Soc., vol. 772, pp. 201-207 (2003).

Wang, Y., et al., "Cotnrolling the shape, orientation, and linkage of carbon nanotube features with nano affinity templates", PNAS, vol. 103, pp. 2026-2031 (2006).
Walters, D. A., et al., "In-plane-aligned membranes of carbon nanotubes", *Chem. Phys. Lett.* vol. 338, pp. 14-20 (2001).
Walther, J. H., et al., "Carbon Nanotubes in Water: Structural Characteristics and Energetics", J. Phys. Chem. B, vol. 105, pp. 9980-9987 (2001).
Whitesides, G. M., et al., "Self-Assembly at All Scales", Science, vol. 295, No. 5564, pp. 2418-2421 (2002).
Wu, Z., et al., "Transparent, Conductive Carbon Nanotube Films", *Science* vol. 305, pp. 1273-1277 (2004).
Xin, H., et al., "DNA-Templated Nanotube Localization", *J. Am. Chem. Soc.* vol. 125, pp. 8710-8711 (2003).
Xin, H., et al., "Directional Orientation of Carbon Nanotubes on Surfaces Using a Gas Flow Cell", *Nano Lett.* vol. 4, No. 8, pp. 1481-1484 (2004).
Xu, Y.-Q., et al., "Controlled Multistep Purification of Single-Walled Carbon Nanotubes", *Nano Lett.* vol. 5, No. 1, pp. 163-168 (2005).
Yakobson, B. I., et al., "Mechanical Properties of Carbon Nanotubes", Carbon Nanotubes, Topics Appl. Phys., vol. 80, pp. 287-329 (2001).
Yan, H., et al., "DNA-Templated Self-Assembly of Protein Arrays and Highly Conductive Nanowires", Science, vol. 301, pp. 1882-1884 (2003).
Yao, Z., et al., "High-Field Electrical Transport in Single-Wall Carbon Nanotubes", *Phys. Rev. Lett.* vol. 84, No. 13, pp. 2941-2944 (2000).
Yu, M., et al., "Three-dimensional manipulation of carbon nanotubes under a scanning electron microscope", *Nanotechnology* vol. 10, pp. 244-252 (1999).
Ziiang, M. et al., "A MEMS nanoplotter with high-denisty parallel dip-pen nanolithography probe arrays", Nanotechnology, vol. 13, pp. 212-217 (2002).
Zhu, F., et al., "Water and Proton Conduction through Carbon nanotubes as Models for Biological Channels", Biophysical Journal, vol. 85, pp. 236-244 (2003).
Zou, S., et al., "Rings of Single-Walled Carbon Nanoturbes: Molecular-Template Directed Assembly and Monte Carlo Modeling", Nano Lett., vol. 7, No. 2, pp. 276-280 (2007).
PCT/US2006/046037, filed Dec. 4, 2006, Intl. Search Report & Written Opinion, mailed Aug. 8, 2008 (14 pages).

US 8,080,314 B2

NANOTUBE ASSEMBLY

RELATED APPLICATIONS

This application is a divisional of U.S. patent application Ser. No. 11/633,095, now U.S. Pat. No. 7,959,974 filed Dec. 4, 2006, which is incorporated by references in its entirety for all purposes, and which claims priority from U.S. Provisional Application No. 60/741,837 filed Dec. 2, 2005, which is also incorporated by reference in its entirety for all purposes.

STATEMENT OF FEDERAL FUNDING

The work described herein was carried out with use of federal research funding under the following grants: Air Force Office of Scientific Research grant no. AFOSR MURI F-49620-00-1-0283, Defense Advanced Research Projects Agency grant no. DARPAMdesensor F49620-01-1-0401, National Institutes of Health, grant no. NIH 1DP1OD000285-01, and the National Science Foundation, grant no. NSF-NSEC EEC-0118025. The Federal government reserves certain rights in the patent.

BACKGROUND

Single-walled carbon nanotubes (SWNTs) are of commercial interest in applications ranging from ultra-small electronic and sensing devices to multifunctional materials (1). Examples include field effect transistors (2), field emission displays (7), and chemical sensors (3,6). Integration of the nanotube material depends on the ability to control the placement, orientation, and shape of the nanotube components within the context of the device on the micrometer- to nanometer-length scale. Positional control over large areas is important. Depending on the intended application, one wants to pattern SWNTs as individual tubes (3,4), small bundles (5), or thin films (6, 8, 9). SWNTs are but one example of nanotechnology building blocks, and other examples include nanotubes generally and nanowires.

Previous work has shown that individual carbon nanotubes can be positioned (10), bent (11), and even welded (12) with nanometer accuracy by using scanning probe instruments. This level of manipulation can be limited to serial and therefore slow processes than span relatively short distances (100 microns). Other assembly methods such as Langmuir-Blodgett techniques (13), external field assisted routes (14-19), electrospinning (20), transfer printing (21), and DNA templates (22, 23) also have been used for nanotube assembly. These parallel methods address the speed limitation posed by conventional scanning probe techniques, but thus far are quite limited with respect to registration control and have demonstrated only coarse placement capabilities.

One approach is to use patterned chemical templates to assemble SWNTs from solutions. For example, SWNTs can be positioned along straight line features comprised of amine-terminated self-assembled monolayers (SAMs) (9, 24-27). See also US patent publication 2004/0166233 ("Depositing Nanowires on a Substrate") to Hong.

Additional background patent literature includes US Patent publications 2004/0245209 to Jung et al (published Dec. 9, 2004); 2005/0269285 to Jung et al. (published Dec. 8, 2005); and 2004/0101469 to Demers (published May 27, 2004).

A need exists, however, to better simultaneously control the position, shape, and/or linkage of nanotubes, nanowires, and in particular carbon nanotubes including SWNTs on the sub-micron scale to better provide sophisticated architectures including for example rings, electronic interconnects, and structured thin films.

A need exists to better adapt nanolithography to carbon nanotube including SWNT placement technology (28,29).

A listing of references is provided later herein for literature citations.

SUMMARY

A variety of embodiments are provided including, among other things, articles, methods of making articles, methods of using articles, and compositions.

One embodiment provides an article comprising: a solid surface comprising at least two different surface regions including: a first surface region which comprises an outer boundary and which is adapted for carbon nanotube adsorption, and a second surface region which is adapted for preventing carbon nanotube adsorption, the second region forming an interface with the outer boundary of the first region, at least one carbon nanotube which is at least partially selectively adsorbed at the interface. The first region can comprise hydrophilic groups which can be carboxylic groups. The second region can comprise hydrophobic groups which can be alkyl groups.

Another embodiment provides an article comprising: a solid surface comprising at least two different surface regions including: a first surface region which comprises an outer boundary and which is adapted for carbon nanotube adsorption, and a second surface region which is adapted for preventing carbon nanotube adsorption, the second region forming an interface with the outer boundary of the first region, at least one carbon nanotube which is sufficiently long with respect to the size and shape of the first surface region so that it is at least partially selectively adsorbed at the interface.

Another embodiment provides a method comprising: providing a solid surface comprising at least two different surface regions including: a first surface region which comprises an outer boundary and which is adapted for carbon nanotube adsorption, and a second surface region which is adapted for preventing carbon nanotube adsorption, the second region forming an interface with the outer boundary of the first region, providing a liquid composition comprising a plurality of carbon nanotubes in at least one liquid solvent, placing the liquid composition on the solid surface, so that at least one carbon nanotube adsorbs to the surface, removing the at least one liquid solvent, wherein the at least one carbon nanotube is at least partially selectively adsorbed at the interface.

Provided herein are methods of using the interface of two-component molecular templates for assembly and manipulation of nanotubes and nanowires, including positioning, orientation, shaping, and linking.

Advantages include among other things ability to align, position, orient shape, and link nanotubes and nanowires. In particular, carbon nanotubes can be linked together based on strong van der Waals interactions between the nanotubes to form ropes. Single conductive pathways can be formed.

DETAILED DESCRIPTION

Introduction

The contents of provisional patent application Ser. No. 60/741,837 filed Dec. 2, 2005 to Mirkin et al., and the contents of Wang et al., PNAS, vol. 103, no. 7, 2026-2031, including supplementary materials, are hereby incorporated by reference in their entirety including figures and working examples.

References cited herein are hereby incorporated by reference and can be used as appropriate by one skilled in the art in the practice of the present invention.

Nanostructured materials are described in *The Chemistry of Nanostructured Materials*, ed. Peidong Yang, including Chapter 4, CVD Synthesis of Single Walled Carbon Nanotubes, page 101-126, and its description of SWNTs, as well as references cited therein.

Microfabrication and nanofabrication is generally described in for example Madou, *Fundamentals of Microfabrication, The Science of Miniaturization*, $2^{nd}$ Ed., CRC, 2002.

Deposition methods, functionalizing surfaces, and nanowires are described in for example Hong, Seunghun, US Patent Publication 2004/0166233, Depositing Nanowires on a Substrate, which is hereby incorporated by reference in its entirety.

Solid Surface

The surface is not particularly limited as long as it can provide the first and second regions, and the interface between the first and second regions, and carbon nanotube adsorption. Generally flat surfaces can be used. The surface can be generally flat in one area but then also have depressions or protrusions in other areas. The surface can be generally smooth and substantially free of rough areas. The surface can be a solid surface; the surface can be the surface of a substrate. The surface can be formed from a substrate which is either monolithic or comprise multiple materials such as a series of layered materials, or it may be surface modified. The substrates can be metal or ceramic or inorganic substrates. Substrates can be adapted to have surface coatings including self-assembled monolayers including those that provide organic tail groups, unreactive tail groups, or reactive functional tail groups. Surface coatings can be organic materials, including low molecular weight and high molecular weight coatings. In particular, a solid substrate surface can be modified with self-assembled monolayers. An inorganic or metallic substrate can be modified with an organic surface layer. Surfaces and substrates used in DPN printing can be used as described in for example U.S. Pat. No. 6,827,979 to Mirkin et al., which is hereby incorporated by reference.

The surface can be adapted for use in a final application such as for example an electronics or transistor application. Hence, the surface can comprise for example electrically conducting, electrically insulating, or semiconductor regions and elements including electrodes for use in field-effect transistors.

Figure 1:
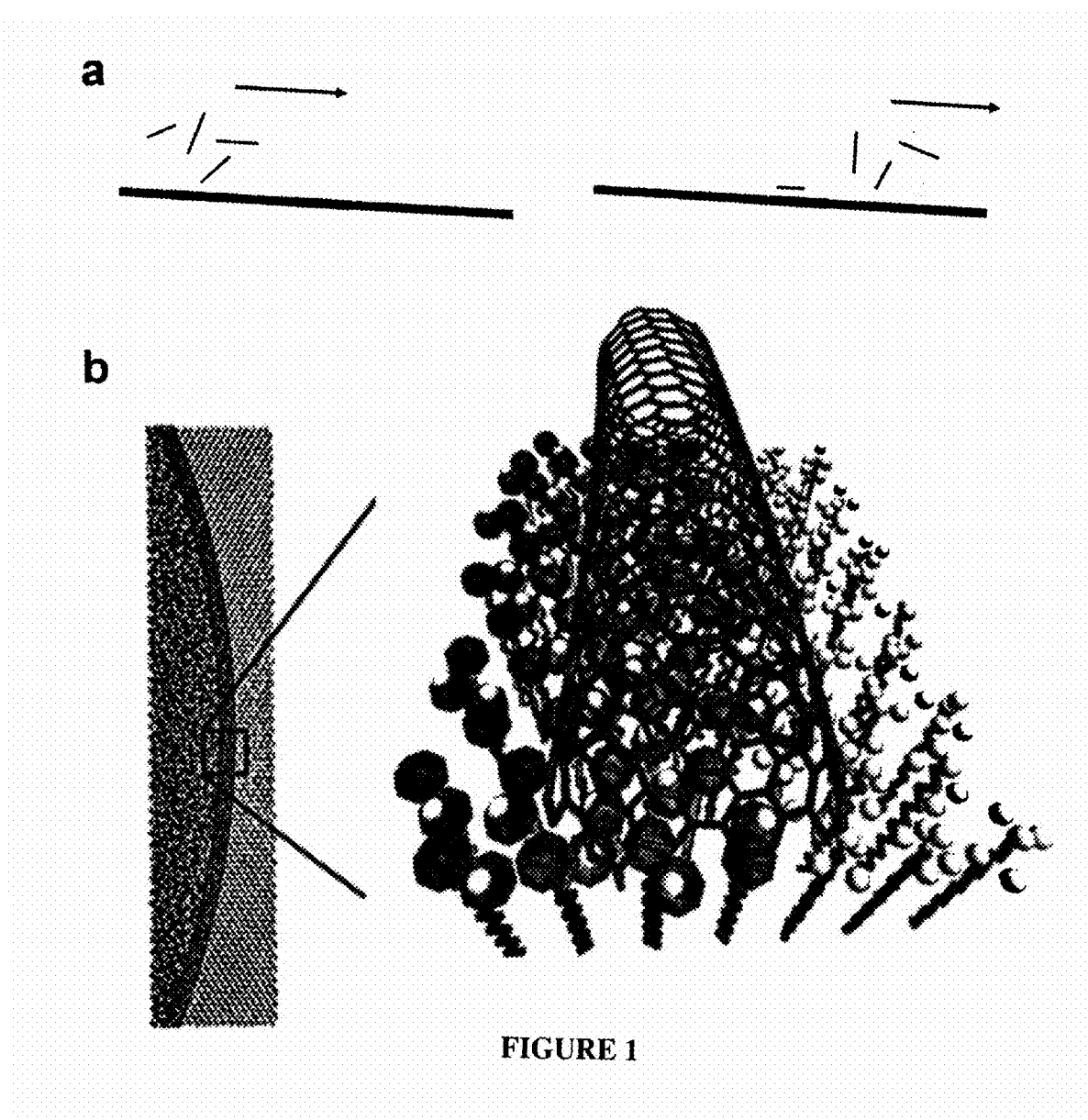
FIG. 1 schematically illustrates the directed assembly process. (a) Schematic illustrating the rolling of a drop of the SWNTs/1-2-dichlorobenzene solution on a two-component surface comprising COOH-SAM and CH3-SAM (b) the SWNTs are selectively transported to the COOH-SAM and pinned at its boundary with the ODT SAM. Upon drying, the SWNT bends to precisely follow the molecular path of the patterned COOH-SAM.

The first and second regions can be adapted to have different affinities for adsorbing carbon nanotubes. For example, FIGS. 1a and 1b shows examples of first and second regions. FIG. 1a shows a side view of the substrate. FIG. 1b shows a top view. The other figures show top views.

First Surface Region

The first surface region can comprise an outer boundary. The first surface region can be adapted for carbon nanotube adsorption. The type of adsorption is not particularly limited and may be affected by whether the nanotube is surface functionalized. Physical adsorption or chemical adsorption can be used. Adsorption based on Van Der Waals interactions can be used.

The first region can be hydrophilic in nature by comprising hydrophilic functional groups at the substrate surface. The first region can comprise polar functional groups. The groups can be for example selected to provide for solvent wetting and low water contact angles (e.g., less than 90°). In particular, the first region can comprise carboxyl functional groups, including in different forms including the anion or acid form or a neutral or basic form. Another example is amino functional groups. Mixtures of functional groups can be used.

The first region can be formed with use of patterning of self assembled monolayer compounds including sulfur-on-gold type of patterning. Examples can be found in U.S. Pat. No. 6,827,979 to Mirkin et al. The functional groups can be provided by compounds represented by X—S—Y where in X is adapted to bind to a substrate (e.g., sulfur binding to gold), S is a spacer such as a —$(CH_2)_x$— spacer wherein x is 2-25, and Y is a polar functional group like carboxyl.

Second Surface Region

The second region can be hydrophobic in nature by comprising hydrophobic groups, or hydrophobic functional groups, at the substrate surface. The second region can comprise non-polar functional groups. The surface can provide for non-solvent wetting and high contact angles with water (e.g., over 90°) In particular, the second region can comprise alkyl functional groups at the substrate surface. Another example is fluorinated compounds including perfluorinated and partially fluorinated. Mixtures can be used.

The second region can be formed with use of deposition or patterning of self assembled monolayer compounds including sulfur-on-gold type of patterning. Examples can be found in U.S. Pat. No. 6,827,979 to Mirkin et al. The functional groups can be provided by compounds represented by X—S—Y where in X is adapted to bind to a substrate (e.g., sulfur binding to gold), S is a spacer such as a —$(CH_2)_x$— spacer wherein x is 2-25, and Y is a non-polar functional group like methyl.

Carbon nanotubes generally will adsorb to the second surface far less than the first surface. The second surface helps prevent carbon nanotube adsorption. In general, non-specific binding of CNTs should be avoided.

The second region forms an interface with the outer boundary of the first surface.

Particularly unexpected good results can be found with the carboxylic/amino system for first and second regions, respectively.

Shapes for the Surface Regions

The first and second regions can be formed so that a variety of shapes and patterns are formed, including shapes and patterns for the interface. The shapes can be either full shapes or can be hollowed out shapes. For example, a full dot can be formed as a first region, or the dot can be hollowed out so that the first region is a ring. The shaped can be symmetric shapes like circles or lines, or non-symmetric shapes. The first region can be formed so that it has a perimeter which is enclosed. Periodic shapes and patterns can be made. The first surface region can comprise a dot, a ring, a line, or a curvilinear structure.

The article can comprise a plurality of first surface regions, a plurality of second surface regions, and a plurality of interfaces. For example, a periodic array can be built. Combinatorial arrays can be built. For example, a region can form a feature such as a dot or a line, and the article can comprise at least 2, at least 10, at least 100, or at least 1,000 features.

Interface Between First and Second Regions

The first and second regions are disposed next to each other so that an interface is present between the first and second region. In particular, the first surface region comprises an outer boundary, and the second region forms an interface with the outer boundary of the first region. In general, the interface is distinct and clean, although in practice depending on the analytical method used to examine the interface the interface may not be perfect and an interfacial region can be determined.

An exemplary interface is created by two self-assembled monolayers disposed next to each other. The first and second regions can be generally co-planar so that the interfacial region is smooth and does not have a drop-off or ridge.

FIGS. 1a and 1b show examples of the interfacial region.

Carbon Nanotube

Carbon nanotubes are known in the art including for example, (1) Ajayan, P. M., *Nanotubes from Carbon*, Chemical Review, 1999, 99(7), p. 1787-1800, and (2) Dai, H. J., *Carbon Nanotubes, Opportunities and Challenges*, Surface Science, 2002, 500 (1-3), p. 218-241, and (3) Baughman et al, Science, 297, 787. In addition, carbon nanotubes are described in Marc J. Madou's *Fundamentals of Microfabrication, The Science of Miniaturization,* 2nd Ed., pages 454-455, including carbon nanotube preparation by CVD from patterned catalysts. This Madou text also describes microlithography and nanolithography, and the use of carbon nanotubes at tips of AFM and STM probes. Carbon nanotubes are also described in the text, Carbon Nanotubes, by Dresselhaus et al., Springer-Verlag, 2000. See also, Special-Section, "Carbon Nanotubes" Physics World, vol. 13, pp. 29-53, 2000. Carbon nanotubes can be single-walled carbon nanotubes (SWNTs), multi-walled carbon nanotubes (MWNTs), nanohorns, nanofibers, or nanotubes. They can be conducting or semiconducting depending on the form of the nanotube. They can be open, closed, and have different kinds of spiral structure. They can be in zigzag and armchair form and have varying steepness which alters the chiral form. Additional description is provided in US Patent Publication 20060115640 to Yodh et al.

Carbon nanotubes can be obtained commercially. The HiPco process can be used to prepare carbon nanotubes (see for example Rice University and Carbon Nanotechnology, Inc.). In this procedure, high pressure and high temperature CO with Fe(CO)5 as a catalyst precursor produce high-quality SWNTs.

Carbon nanotubes can be used both as individual carbon nanotubes and also as a plurality of carbon nanotubes, wherein a statistical average and deviation from the mean can be used to characterize the nanotubes.

In particular, the carbon nanotube can be a single wall carbon nanotube.

The carbon nanotube can be derivatized before use.

The carbon nanotube can be purified before use.

The length of the carbon nanotube is not particularly limited but can be for example, about 10 nm to about 5 microns, or about 25 nm to about 5 microns, or about 10 nm to about 200 nm, or about 25 nm to about 200 nm.

The carbon nanotube, or the plurality of nanotubes, can form structures which have a height of about 10 nm or less, or about 5 nm or less, or about 2 nm or less, or about 10 nm to about 50 nm. The height can result from an individual SWNT or for a plurality of SWNTs. Heights can be used which provide for thin film applications or single SWNT transistors.

A plurality of carbon nanotubes can be adsorbed which have an average length of at least one micron.

The carbon nanotubes can form an arc or a circle.

Adapting SO Carbon Nanotube at the Interface

At least one carbon nanotube is at least partially selectively adsorbed at the interface. The experimental parameters can be adapted as described, for example, in the working examples and discussed in the modeling, so that the carbon nanotube is at least partially selectively adsorbed at the interface. Only a portion of the longer nanotube need be at the interface, but in any event, the amount of the nanotube at the interface is higher than if random distribution of the nanotube was present on the first region. For example, at least 10%, or at least 20%, or at least 30% of the length of the carbon nanotube can be disposed at the interface. In general, this occurs with use of carbon nanotubes which are longer than the feature sizes to which they absorb.

In one embodiment, the carbon nanotube is substantially disposed at the interface of the first and second regions. For example, at least 70%, or at least 80%, or at least 90% of the length of the carbon nanotubes can be disposed at the interface. Or, for example, for a plurality of nanotubes, at least 70%, or at least 80%, or at least 90% of the length of the nanotubes can be disposed at the interface with the remaining portions leaving the interface to be disposed on in many cases the first region rather than the second region.

The carbon nanotube can be horizontally aligned so that it lays on the substrate either totally or substantially.

Hence, an embodiment is an article comprising: a solid surface comprising at least two different surface regions including: a first surface region which comprises an outer boundary and which is adapted for carbon nanotube adsorption, and a second surface region which is adapted for preventing carbon nanotube adsorption, the second region forming an interface with the outer boundary of the first region, at least one carbon nanotube which is sufficiently long with respect to the size and shape of the first surface region so that it is at least partially selectively adsorbed at the interface.

One skilled in the art can experiment with CNT length and the first surface region shape and size to find when the selective adsorption at the interface becomes important. One can look for an enrichment effect where the CNT is not just randomly disposed in the first region.

In one embodiment, the outer boundary is circular. In another embodiment, the carbon nanotube forms a ring. In one embodiment, the outer boundary is circular and the carbon nanotube forms a ring. In one embodiment, the first region comprises a ring or a circular dot. In one embodiment, the first region comprises a circle with a diameter, and the length of the carbon nanotube is longer than the diameter.

Nanowires, Nanotube Embodiments

Other examples include nanowires and nanotubes, including inorganic systems not limited to carbon systems. Different types of nanowires exist and can be used, including for example metallic (e.g., Ni, Pt, Au), semiconducting (e.g., InP, Si, GaN, ZnSe, CdS, etc.), and insulating (e.g., $SiO_2$, $TiO_2$). Nanowires can be silicon nanowires, metallic nanowires including gold or nickel, and metal oxide nanowires. Other materials useful for forming nanowires include semiconductor materials including Group II-VI semiconductor materials. Molecular nanowires are composed of repeating molecular units either organic (e.g. DNA) or inorganic (e.g. $Mo_6S_{9-x}I_x$). High aspect ratio nanotubes and nanowires can be used including those having aspect ration of 500 or more, 1,000 or more, or 5,000 and more. These high aspect ratio structures can be open or closed, or open but filled with different material, and can be called wires, rods, tubes, fibers, and the like. Nanowires are described in for example Hong, Seunghun, US Patent Publication 2004/0166233, Depositing Nanowires on a Substrate, which is hereby incorporated by reference in its entirety.

Methods of Making

Another embodiment is the method of making the articles described herein. For example, an initial step can be providing a solid surface comprising at least two different surface regions, a first surface region which comprises an outer boundary and which is adapted for carbon nanotube adsorption, and a second surface region which can be adapted for preventing carbon nanotube adsorption. The second region can form an interface with the outer boundary of the first region.

Various lithographies, microlithographies, nanolithographies, and printing technologies can be used including for example DPN printing, microcontact printing, nanoimprint lithography, scanning probe lithography, electron beam lithography, photolithography, and the like.

In particular, direct-write nanolithography can be used to make the substrate. Direct-write technologies can be carried out by methods describe in, for example, Direct-Write Technologies for Rapid Prototyping Applications: Sensors, Electronics, and Integrated Power Sources, Ed. by A. Pique and D. B. Chrisey, Academic Press, 2002. Chapter 10 by Mirkin, Demers, and Hong, for example, describes nanolithographic printing at the sub-100 nanometer length scale, and is hereby incorporated by reference (pages 303-312). Pages 311-312 provide additional references on scanning probe lithography and direct-write methods using patterning compounds delivered to substrates from nanoscopic tips which can guide one skilled in the art in the practice of the present invention.

Direct-write nanolithography, in addition, has been described in the following documents which are each hereby incorporated by reference in their entirety and form part of the present disclosure. (1) Piner et al. Science, 29 Jan. 1999, Vol. 283 pgs. 661-663. (2) U.S. Pat. Nos. 6,635,311 and 6,827,979. (3) Demers et al. Angew Chem. Int. Ed. Engl. 2001, 40(16), 3069-3071, (4) Demers et al. Angew Chem. Int. Ed. Engl. 2001, 40(16), 3071-3073, (5) M. Zhang et al., Nanotechnology, 13 (2002), 212-217 (parallel DPN printing with array of microfabricated probes), (6) A. Ivanisevic et al., J. Am. Chem. Soc., 2001, 123, 12424-12425 (particle assembly with opposite charged species), (7) U.S. Patent Publication 2003/0022470 published Jan. 30, 2003 to Liu et al. ("Parallel, individually addressable probes for nanolithography").

DPN® and DIP PEN NANOLITHOGRAPHY® are trademarks of Nanoink, Inc. (Chicago, Ill.) and are used accordingly herein. In the DPN® printing process, which can be carried out using an NSCRIPTOR instrument from NanoInk, an ink is transferred to a substrate from a tip. The transferred ink, if desired, can be used as a template for further fabrication. The advantages and applications for DPN® printing are numerous and described in these references. DPN® printing is an enabling nanofabrication/nanolithographic technology which allows one to practice fabrication and lithography at the nanometer level with exceptional control and versatility.

DPN® printing provides for fine control of the patterning which is not provided by other methods. However, DPN® printing can also be automated which provides rapid production. Moreover, the structures produced by DPN® printing are generally stable, as DPN® printing allows for the ink to be covalently bonded or chemically adsorbed to the substrate rather than merely physically adsorbed or mechanically locked in. DPN printing does not require that the substrate surface be made porous to accept the ink in a mechanical lock. Rather, the strategically patterned ink materials, chemically bound at predefined locations by DPN printing, are then used for directing desired materials such as, for example, carbon nanotubes at the predefined locations on the substrate.

U.S. Patent Publication 2002/0063212, published May 30, 2002 to Mirkin et al., discloses many useful embodiments which are hereby incorporated by reference including, for example, use of tips (paragraphs 0052-0054); substrates (0055); patterning compounds (0056-0078); tip coating methods (0079-82); patterning (0083-88); alignment (0089); nanoplotter format (0090-0092); multiple patterning compounds (0093); other methods (0094-0095); resolution parameters (0096-0100); uses including arrays and detection methods (0101-0106); software (0107-0128); kits (0129); instruments (0130); and imaging methods (0130-0136). Seven working examples are provided (0137-0211), which are incorporated by reference in their entirety. An appendix related to computer software is also provided and incorporated by reference (0212-0264).

This type of nanofabrication and nanolithography in particular can be difficult to achieve with many technologies that are more suitable for micron scale work.

Another step is providing a liquid composition comprising a plurality of carbon nanotubes in at least one liquid solvent. Carbon nanotubes can be suspended or dispersed in the liquid. A true solution need not form. The solvent can be an organic solvent, an aromatic solvent, a halogenated solvent, a polar solvent, a non-polar solvent, an aprotic solvent, and the like. Carbon nanotubes can also be suspended with the aids of surfactants or polymers. (see for example O'Connell et al., "Reversible water-solubilization of single-walled carbon nanotubes by polymer wrapping." *Chemical Physics Letters* 2001, 342, 265-271; O'Connell et al., Band gap fluorescence from individual single-walled carbon nanotubes, Science (2002), 297(5581), 593-596.) A variety of methods can be used to prepare this composition including simple mixing and agitation of the solvent and carbon nanotubes. The composition can be purified if desired.

Another step is placing the liquid composition on the solid surface so that at least one carbon nanotube adsorbs to the surface. The liquid can be left until adsorption is complete. It can be agitated. The methods to do this step are not particularly limited.

Another step is removing the at least one liquid solvent by for example washing or evaporation.

Figure 13:
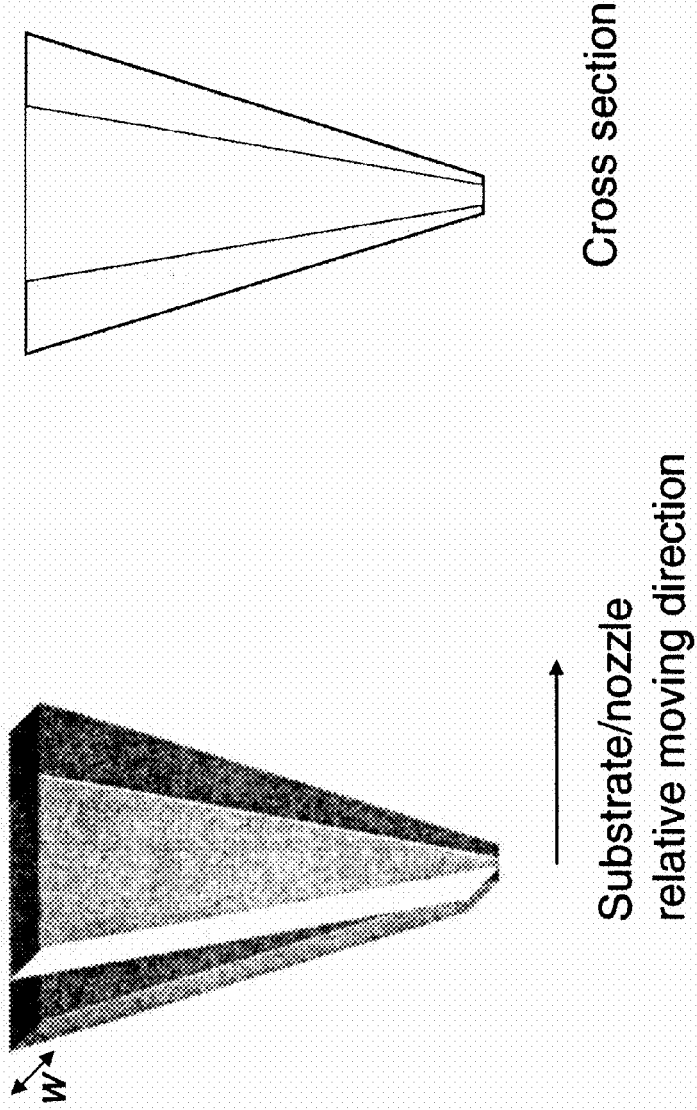
FIG. 13 illustrates a device for applying the carbon nanotubes with solvent.

FIG. 13 illustrates a device for applying the carbon nanotubes with solvent. This embodiment provides a method of depositing nanotube solution from a flat, thin nozzle in proximate contact (via the liquid) with the assembling substrate placed horizontally, e.g., less than 30° from the horizon. The nozzle and the substrate can be placed in relative motion at a constant rate that allows sufficient time for the nanotubes to contact with the affinity template. This embodiment can be useful for assembly over large areas. The nozzle can have a width W which can be as wide as the substrate used for nanotube deposition. Such a nozzle can be made and used by methods known in the art.

The solvent dispersion containing nanowires and nanotubes, as needed, can be purified before use.

Methods of Using and Application

Applications and methods of use for carbon nanotubes include for example conductive and high strength composites, membranes, transistors, field effect transistors, energy storage and energy conversion devices, sensors, field emission displays and radiation sources, hydrogen storage media, nanometer-sized semiconductor devices, probes, and interconnects. The background section also describes applications, as well as the references cited herein.

Other examples include transparent conductive thin films and catalyst supports. Ropes can be used in devices such as mechanics-based RAMs.

Filtration membranes can be made wherein the carbon nanotubes do not cross over the areas designed to not bind nanotubes (second region areas) and follow the shape defined by the interface. Hence, for example, round holes can be formed. The holes can have a diameter of about 10 nm to about 1,000 nm, or about 25 nm to about 500 nm.

Modeling

If desired, the interactions between the surface regions, the carbon nanotubes, and the solvent can be modeled. However, the presently claimed invention in its various embodiments is not limited by theory.

A series of non-limiting working examples are described and discussed.

WORKING EXAMPLES

SWNTs were attracted to the hydrophilic portions of a gold substrate patterned by dip pen nanolithography (DPN) printing and more specifically to the boundary between hydrophilic and hydrophobic SAM features made of 16-mercaptohexadecanoic acid (MHA) and 1-octadecanethiol (ODT), respectively. The process used solvent as a carrying media for the carboxylic acid-terminated features and allowed one to control the manipulation and assembly (aligning, positioning, shaping, and linking) of SWNTs on the micron- to sub-100 nm length scale, including over large areas by use of microcontact printing (30) and parallel DPN printing (31).

Figure 2:
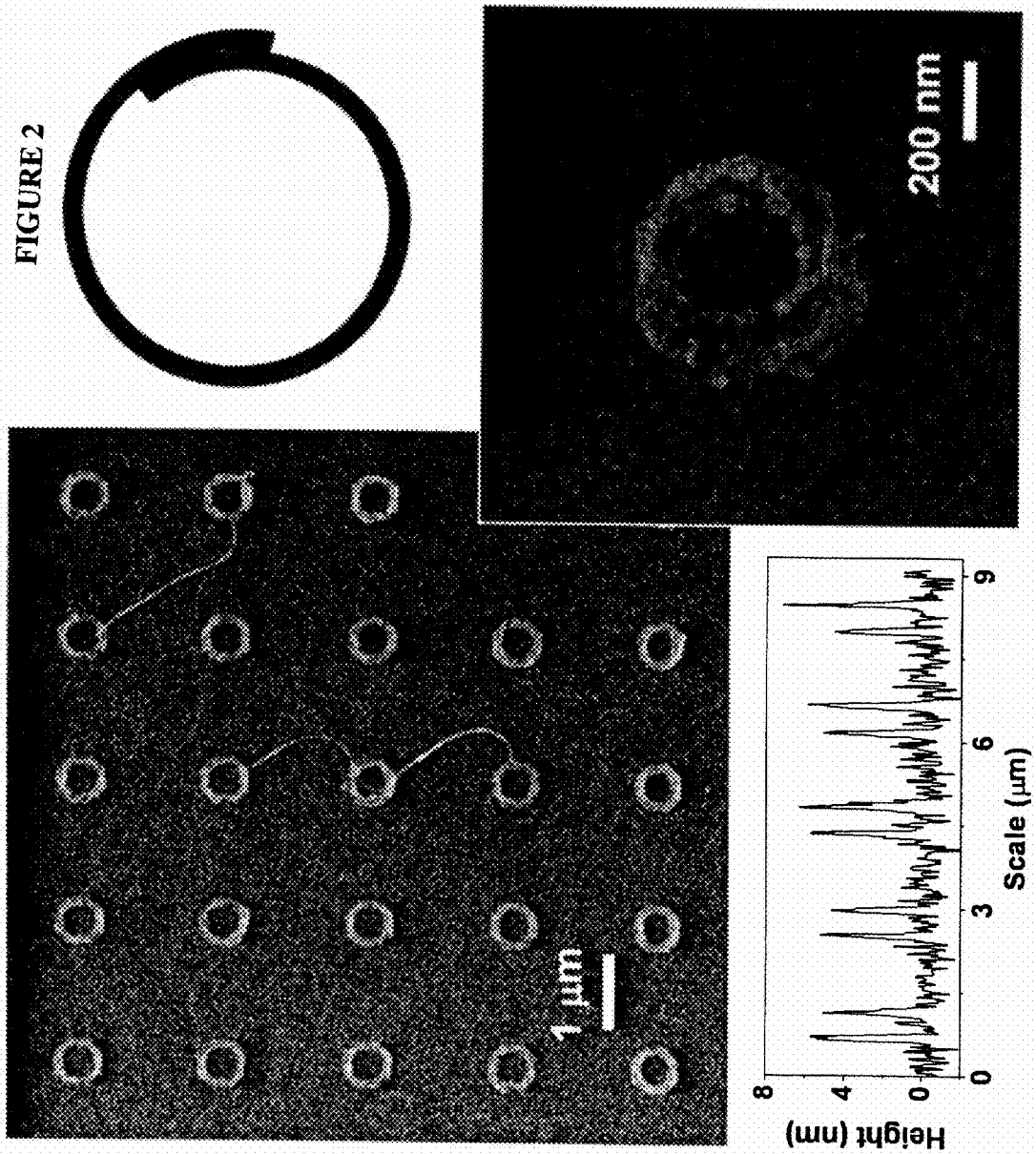
FIG. 2 shows SWNTs assembled into rings and nano letters. (left) AFM tapping mode topographic images, (upper) and height profiles (lower) of SWNT rings in a 5×5 array. (right) A zoom-in view of one SWNT ring (lower) and a molecular model of a coiled SWNT. (upper)
Figure 3:
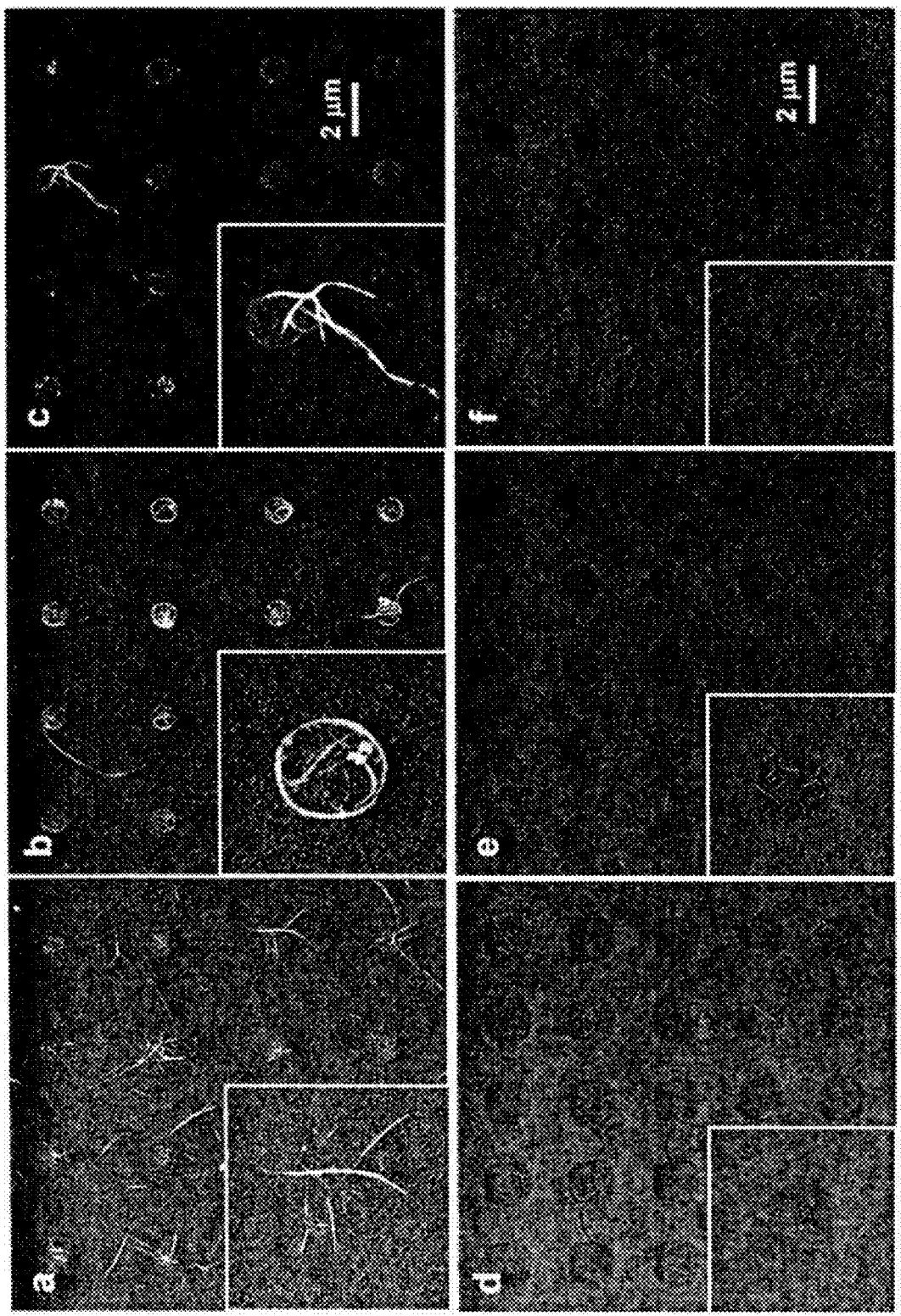
FIG. 3 shows the assembly of SWNTs depends on the surface functional groups. (a-c) AFM tapping mode topographic images of a series of substrates with one micron MHA dot arrays passivated with MUO (a), ODT (b), and PEG-SH (c). These dots show that ODT is the superior passivation layer. (d-f) AFM phase images of a second series of two micron dots of MUO (d), AUT (e), and PEG-SH (f), passivated with ODT. None of these show the better SWNT assembly observed from the MHA/ODT system in b. (insets) Shown are zoom-in images of a selected dot. All images were taken at a scan rate of 0.5 Hz. The height scale is 20 nm, and the phase lag is 10°.

To evaluate the prospect of using SAM boundaries for controlling the assembly of SWNTs, DPN printing was used to generate patterns of MHA comprising lines, dots, rings, and even alphabetical letters on a gold substrate. The exposed gold regions of the substrate were passivated with ODT. A drop of 1,2-dichlorohenzene containing SWNTs was then rolled over the patterned substrates (FIG. 1a). Because 1,2-dichlorobenzene wets the MHA features but not the ODT passivated regions, SWNTs are guided and localized on the hydrophilic regions of the substrate. As the solution containing the SWNTs evaporates, the nanotubes are attracted both to each other and the boundary between the ODT and MH. This evaporation creates a high local concentration of the SWNTs at the SAM boundaries and almost exclusive assembly on the MHA features (FIG. 1b). There is believed to be a strong van der Waals attraction between the SWNTs and the carboxylic acid moieties of the MHA, which is apparent in molecular modeling studies (see below). Because the tubes are too long to assemble within an individual feature they are organized at the interface of the SAMs and bent along the perimeter of the features to maximize the overlap with the MHA feature and minimize the tension arising from nanotube bending. In the case of dots or rings, this assembly process results in circular structures and substantial bending of the SWNTs, the extent of which depends on the radius of curvature (FIGS. 2 and 3). Note that within these features the SWNTs follow the perimeter of the dot and form continuous architectures through intertube linking.

Figure 6:
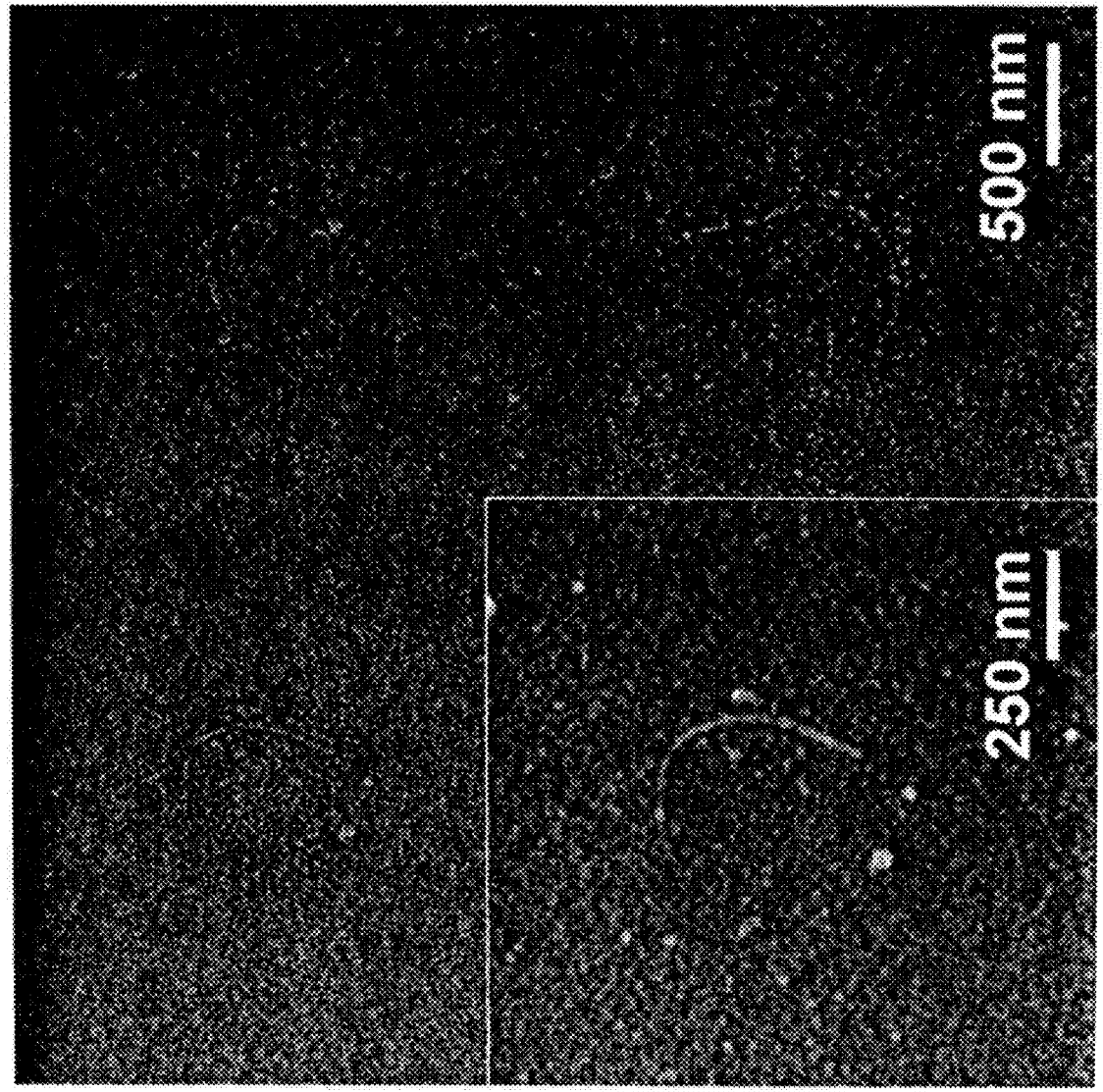
FIG. 6 shows AFM tapping mode phase and topographic images of SWNT nanoarcs. Phase image of a 2×2 MHA ring array, illustrating that short SWNTs bend to form sub-micron sized arcs without closing the rings. (inset) An enlarged topographic image of one of these rings. All images were taken at a scan rate of 0.5 Hz. The height scale is 20 nm, and the phase lag is 25°.
Figure 7:
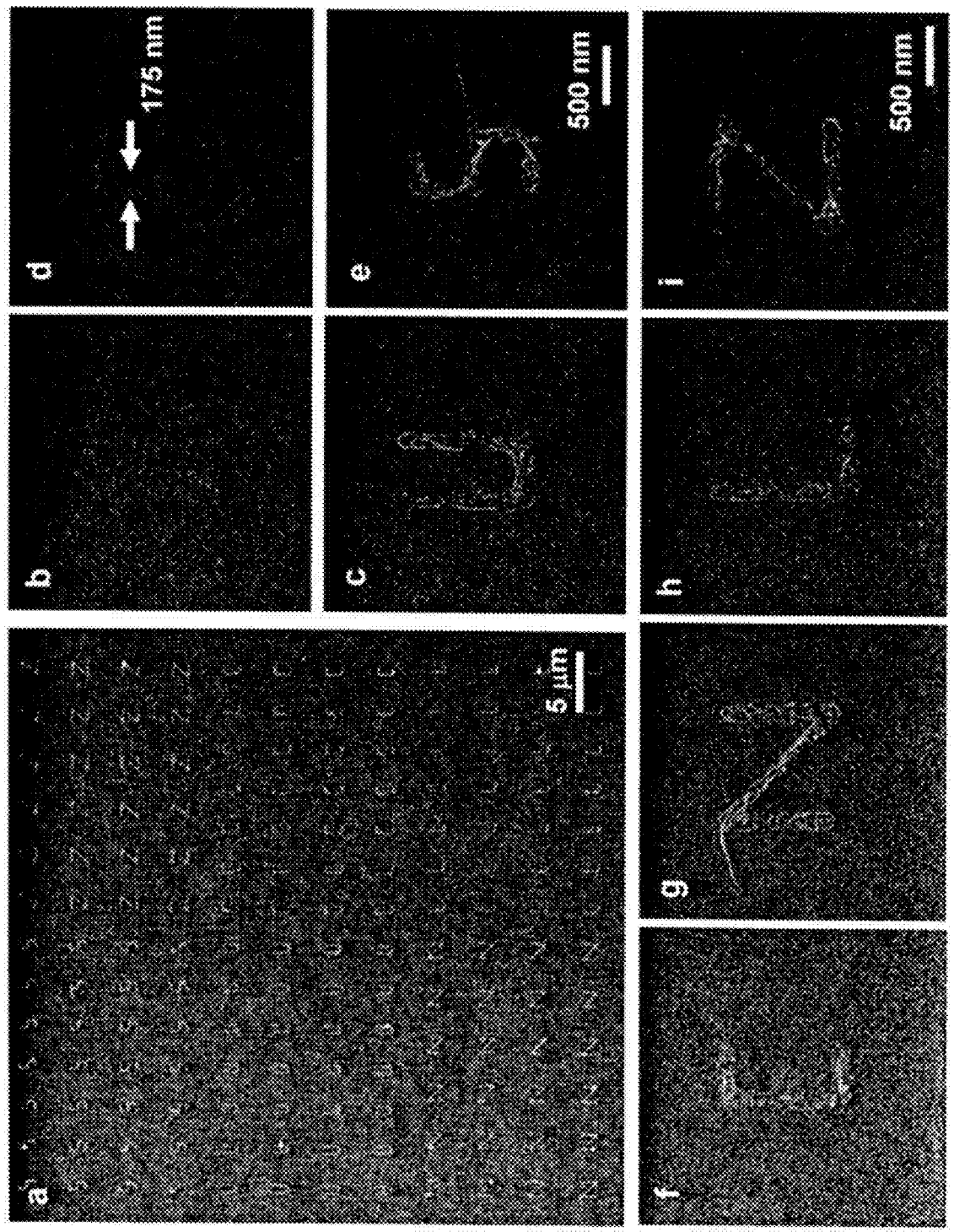
FIG. 7 shows AFM tapping mode topographic images of SWNT letters. (a) whole array (45×45 microns), including the letters S, Z, U, C, N, and L. (b-i) Zoom in view of individual letters. Note that b and d are the patterned MHA nanoletters before SWNT deposition. All images were taken at a scan rate of 0.5 Hz. The height scale is 20 nm.

Circular structures made of SWNTs are unusual (17, 18, 32). These structures show interesting curvature-dependent magnetic and electronic properties (33, 34). Rings of SWNTs, ≈500 nm in diameter, were first observed as a low-yield side product in nanotube synthesis (32). Recently, ring structures were produced in solution by an ultrasonication method (17) and ring closure reactions (18). With the present approach, such SWNT rings can easily be formed and positioned in an ordered array on a surface (FIG. 2a). For example, 1- to 3 µm-long nanotubes form ring structures on 170-nm-wide, 650-nm-diameter MHA ring features on an Au surface, with exposed Au passivated with ODT. The average height of each SWNT ring is 6±2 nm, demonstrating that these are stacked intertwined structures. They are about five times thinner than the analogous structures formed by ultrasonication (17). By using shorter SWNTs (about 0.4-1.5 µm), it has been have further demonstrated that SWNTs readily bend to form sub-µm-sized arcs. Even greater control is demonstrated by shaping SWNTs into nano letters with this approach (see FIGS. 6 and 7).

Figure 8:
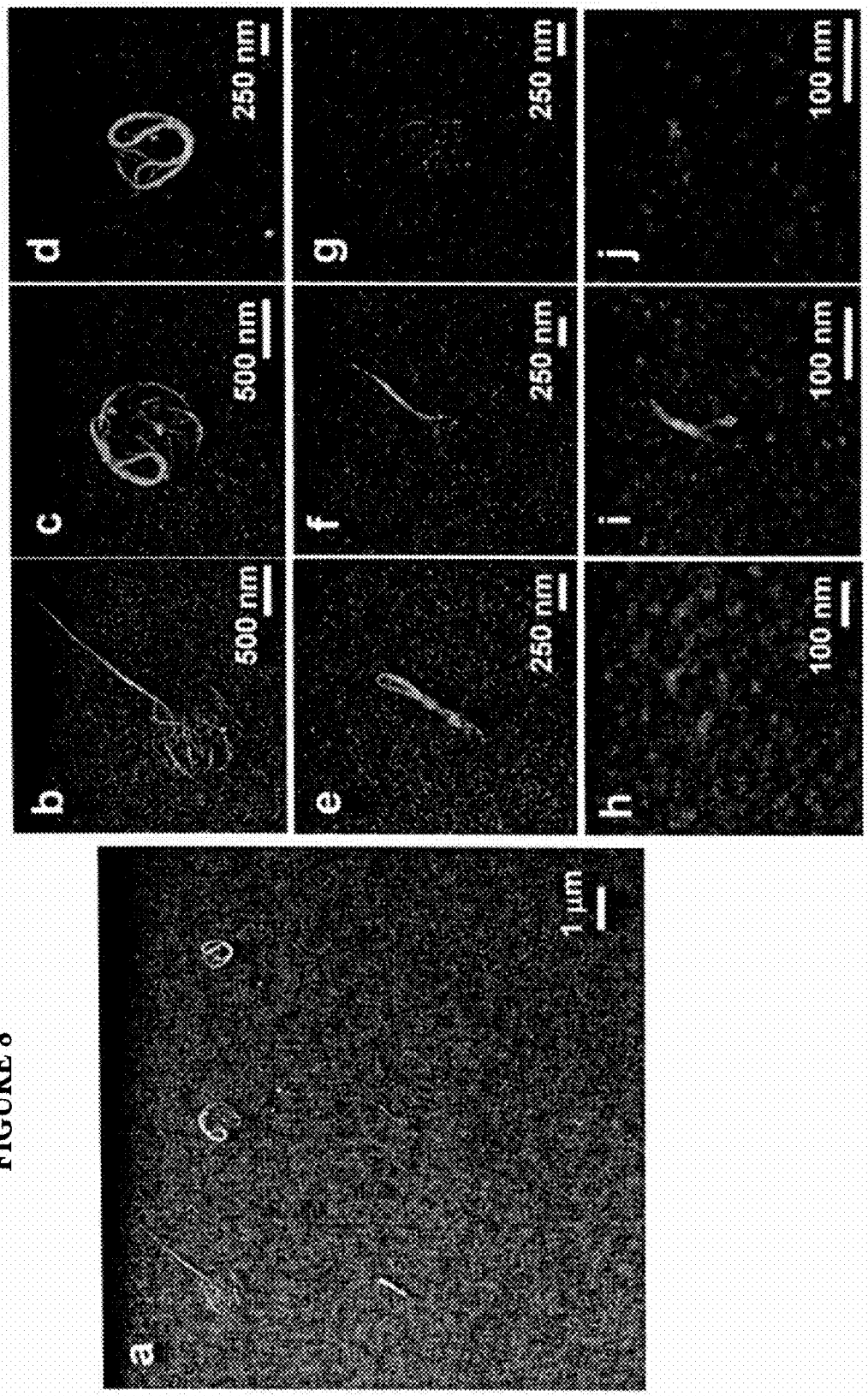
FIG. 8 shows AFM tapping mode topographic images illustrating the dot size influence for trapping SWNTs. (a) array of 3×3 dots with sizes of 1 micron, 875 nm, 650 nm, 500 nm, 375 nm, 250 nm, 200 nm, 140 nm, and 90 nm. (b-j) zoom-in views of each individual dot. The height scale is 20 nm. All images were taken at a scan rate of 0.5 Hz.
Figure 9:
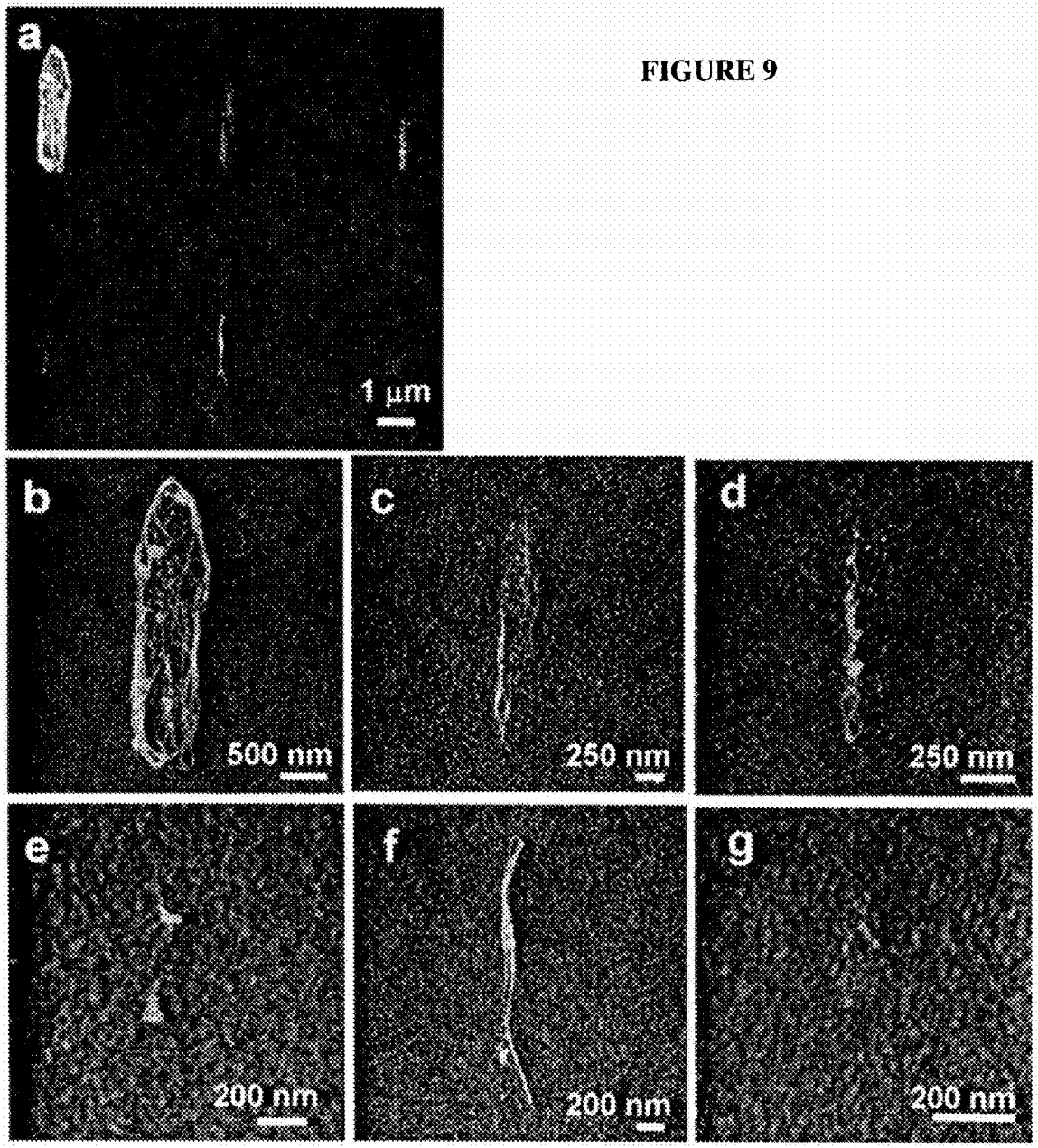
FIG. 9 shows AFM tapping mode topographic images illustrating the line size influence for trapping SWNTs. (a) array of 3×2 lines with sizes of three microns×750 nm, 2.2 microns×400 nm, 1.5 microns×250 nm, 875 nm×150 nm, 450 nm×120 nm, and 450 nm×100 nm. (b-g) zoom-in views of each individual line. All images were taken at a scan rate of 0.5 Hz. The height scale is 20 nm.

To more fully understand and use this system, one can elucidate the driving force for the assembly process and the resolution at which SWNTs can be patterned. To address the resolution issue, the inventors used DPN printing to pattern Au substrates with MHA dots and lines with different dimensions over the micrometer to sub-100-nm length scale. This technique allows one to study the process in combinatorial format under one set of experimental conditions. These experiments clearly show that SWNTs assemble on all features studied, including the smallest dots (90 nm in diameter) and the thinnest lines (450×100 nm) (see FIGS. 8 and 9).

It was found that the choice of affinity template SAM and passivating SAM pair is important for achieving this level of precision in the manipulation and assembly of SWNTs. When the passivation layer was 1-mercaptoundecanol (MUO) or 11-mercaptoundecyl-penta-ethyleneglycol (PEG-SH), the SWNTs assembled on the MHA features but not along the edges of such structures as in the case of the ODT/MHA system (FIG. 3a-c). Although dots of MUO, PEG-SH, and 11-amino-1-undecane-thiol (AUT), where the gold substrate was passivated with ODT, all show affinities for the SWNTs, the interaction seems weaker as compared with MHA as evidenced by a lower density of SWNTs on such features (FIG. 3d-f). Surprisingly, although $NH_2$-SAMs were the focus of previous studies (24-26), MHA showed a higher tendency than AUT to assemble and surface-confine SWNTs.

Figure 10:
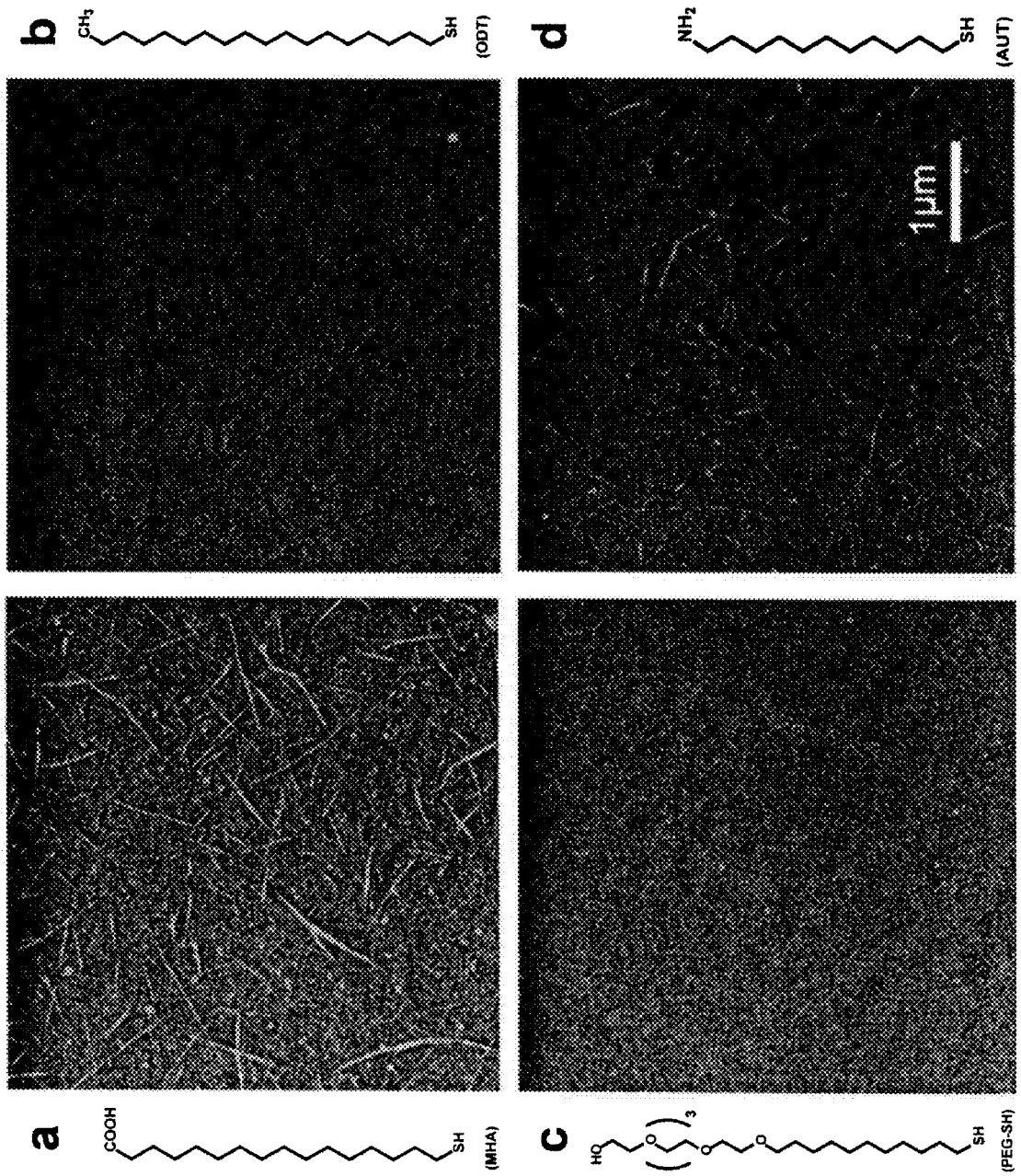
FIG. 10 shows affinity of SWNTs to different alkanethiol SAMs formed on gold substrates. (a) MHA. (b) ODT. (c) PEG-SH. (d) AUT. All images were taken at a scan rate of 0.5 Hz. The height scale is 20 nm.

Contact angle measurements showed that 1,2-dichlorobenzene wets all but the ODT SAMs on gold. The static contact angle for 1,2-dichlorobenzene on ODT SAMs was determined to be 60±2°, whereas the contact angles for the other SAMs were all <10°. Because the solvent wets the COOH-SAMs but not the $CH_3$-SAMs, no solvent remains on the $CH_3$-SAM as the substrate is pulled from the SWNT solution. In contrast, all of the other surfaces retain a thin liquid film, which results in nonuniform SWNT assembly. Compared with the SAMs of MUO, PEG-SH, and AUT, dot features of such materials with surrounding regions passivated with ODT show higher densities of SWNTs on the affinity template portions of the surface (see FIG. 10). These observations strongly suggest that the solvent/substrate interactions are in part responsible for localizing the SWNTs on the MHA patterns.

When a SWNT is driven close to the MHA pattern in the ODT/MHA system, Monte Carlo simulations show that van der Waals attractions between the MHA and SWNT provide the driving force for assembly. Using a parallel Monte Carlo program package and the Amber force field (35), it was obtained the following relative interaction energies between a [9,6] SWNT and its surroundings: −0.88 eV per nm SWNT for $E_{SwNT/solvent}$ the interaction of a SWNT with the 1,2-dichlorobenzene solvent), −0.84 eV per nm SWNT for $E_{SwNT/solvent}$ (the interaction with a $CH_3$-SAM), and −1.05 eV per nm SWNT for $E_{SwNT/COOH-SAM}$ (the interaction with a COOH-SAM). This ordering, COOH-SAM>>solvent>$CH_3$-SAM, favors SWNT adsorption from solvent onto the COOH-SAM and not the $CH_3$-SAM. Interestingly, the interaction of a SWNT with AUT, —087 eV per nm SWNT, is much weaker than that for MHA, manifesting the important role of van der Waals interactions in the assembly of SWNTs. In addition, if the tube is sufficiently long (length greater than the size of the MHA feature) and flexible, it will maximize its interaction with the COOH-SAM and minimize strain energy by aligning with the outer boundary of the COOH-SAM.

By balancing these interaction energies, it can be possible to predict the size of a COOH-SAM for trapping a SWNT of a given length. For a SWNT with a fraction X of its length in van der Waals contact with the COOH-SAMs and the remainder, 1−X, in contact with the $CH_3$-SAMs, the thermodynamic requirement for assembly is, $$X\text{-}E_{SwNT/COOH-SAM+}(1\text{-}X)E_{SwNT/CH_3\text{-}SAM} \leq E_{SwNT/solvent} \quad [1]$$

Solving Eq. 1 gives $x \geq 19\%$. This $x$ value indicates that a [9,6] SWNT can be stabilized on the surface even if only 19% of its length is in contact with the COOH-SAMs. In other words, a 19-nm-wide stripe of the COOH-SAM is sufficient for trapping a [9,6] SWNT that is 100 nm in length, even in the extreme situation where the nanotube is perpendicular to the stripe. For a SWNT making a smaller angle with respect to the stripe, trapping requires an even smaller stripe width.

Figure 4:
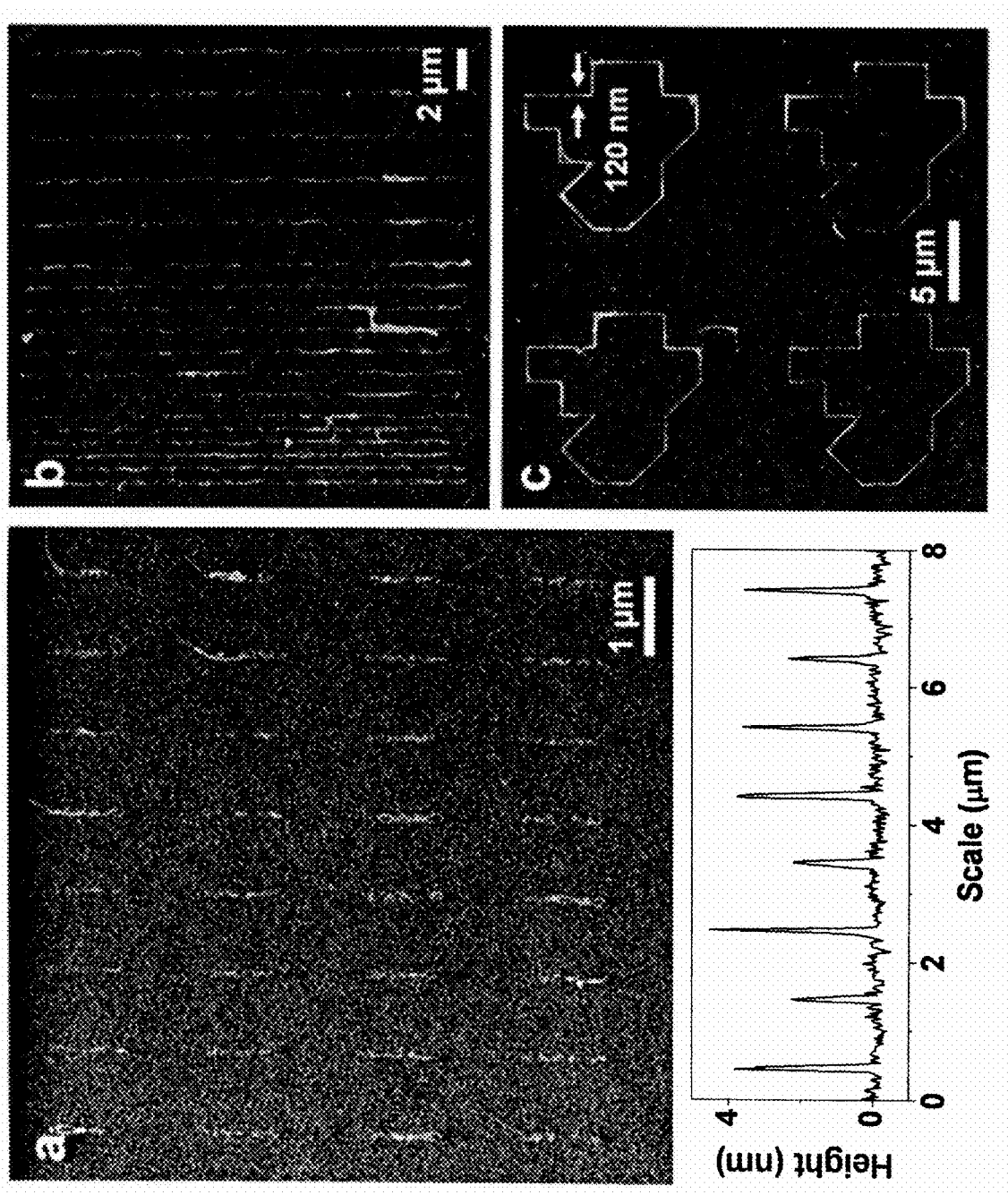
FIG. 4 shows AFM tapping mode topographic images of selected SWNT arrays. (a) Parallel aligned SWNTs with a line density approaching $5.0 \times 10^7/cm^2$. (b) Linked SWNTs following MHA lines (20 microns×200 nm) spaced by two microns, one micron, and 600 nm. (c) random line structure, showing the precise positioning, bending, and linking of SWNTs to a MHA affinity template. All images were taken at a scan rate of 0.5 Hz. The height scale is 20 nm.

Based on the aforementioned observations, this approach appears ideal for the assembly of SWNTs in a dense array on surfaces. Indeed, FIG. 4a shows an array of parallel aligned SWNTs assembled on MFIA patterns (1 µm×130-nm lines at a line density of $5.0×10^7/cm^2$) with nearly 100% occupancy. Atomic force microscopy (AFM) heights are consistent with individual SWNTs or small bundles on each feature. It was found that the line width of MHA required for the assembly is only ≈1/10 that of the $NH_2$-SAMs, resulting in a density >10 times higher than what could be achieved previously (25). The decrease in required line width is essential for the precise assembly of short SWNTs (10-50 nm) for high-performance field effect transistors (36).

Figure 11:
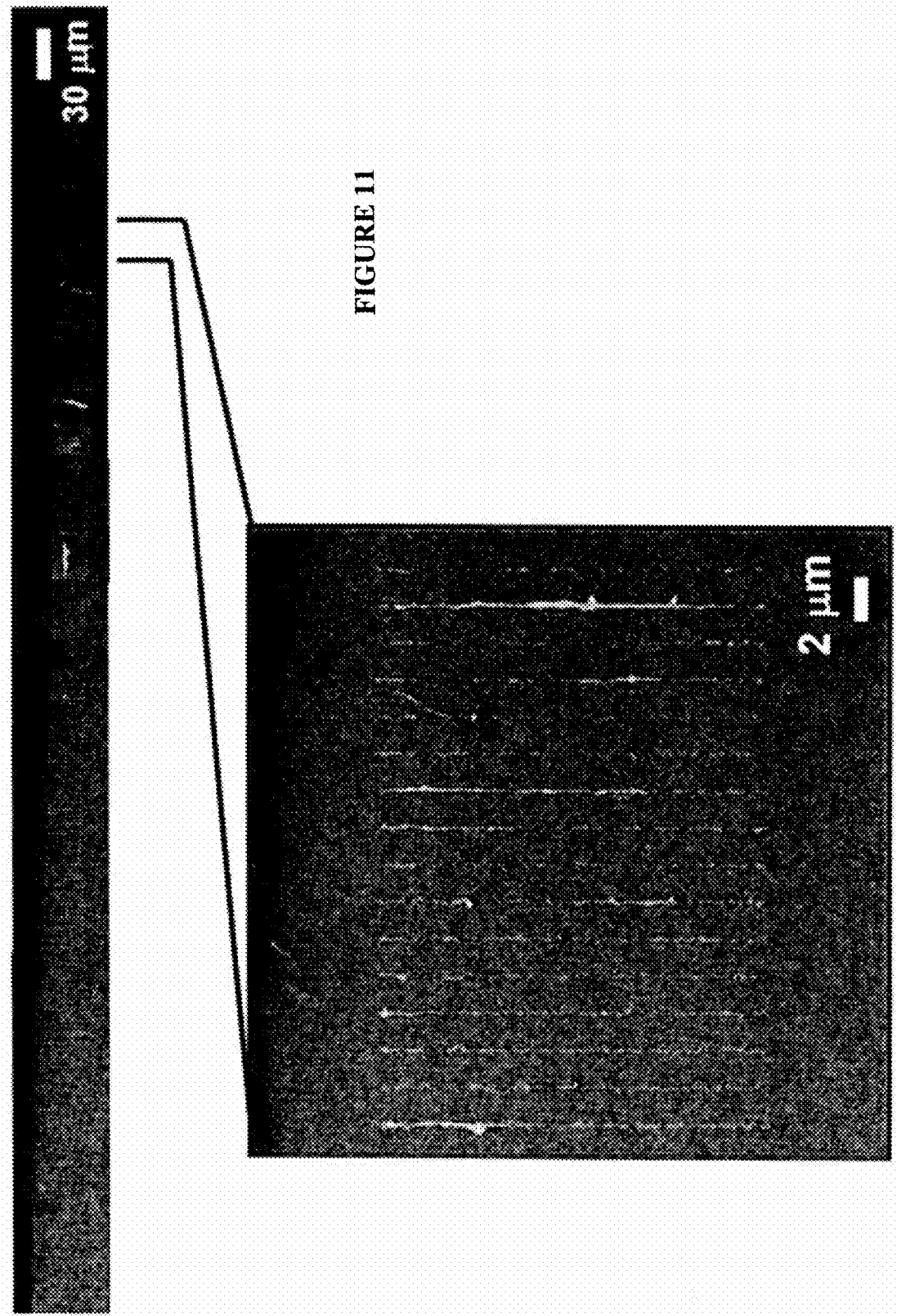
FIG. 11. SWNTs assembled along MHA line features that were defined by parallel DPN printing with a 26-pen array.
Figure 12:
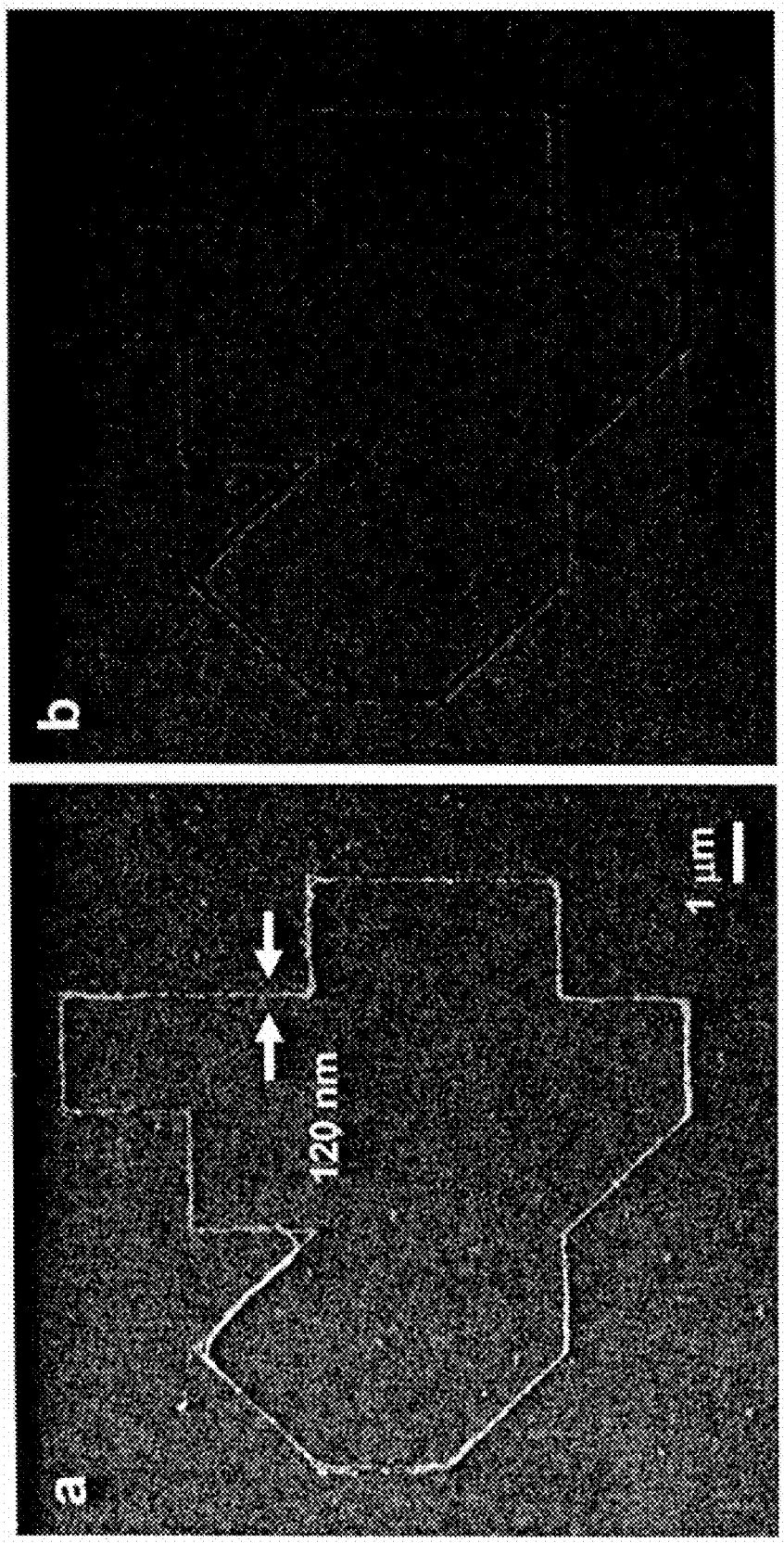
FIG. 12. AFM tapping mode topographic (a) and phase (b) images of a SWNT random circuit. This image is a zoom-in view of the array shown in FIG. 4c. The SWNTs precisely position, bend and link to follow the random path of the MHA line. All images were taken at a scan rate of 0.5 Hz. The height scale in a is 20 nm and 20° of phase lag in b.

As the size of the MHA pattern is increased, the same spot is often occupied by additional SWNTs, with the number being approximately proportional to the volume of the trapped solution. Because of the strong van der Waals attraction between SWNTs (−1.22 eV per nm contact), additional SWNTs can be deposited on the same site, intertwining with each other, and extending to bridge SWNTs on nearby MHA features. As a result, the spacing between SWNTs cannot be reduced to a distance much smaller than the tube length without effecting feature cross-linking or sacrificing SWNT feature occupancy. To reduce the van der Waals attraction, it was decided to functionalize the SWNT sidewalls with dodecyl groups as described (37). The functionalization increased the solubility of SWNTs in 1,2-dichlorobenzene and resulted in more uniform assembly. Because the dodecyl groups can be thermally cleaved from the tubes at 200° C. (37), these groups can act as nondestructive spacers for fine-tuning the interactions between the tubes. Alternatively, one can take advantage of van der Waals attraction to link tubes to make more sophisticated interlinked structures. For example, µm-long SWNTs were assembled into arrays of continuous, parallel aligned, sub-µm-spaced nanowires (FIG. 4b and see FIG. 11). Because of the unusual electrical properties of SWNTs, including an electrical conductivity rivaling copper and a current carrying capacity up to $10^9$ A/cm$^2$ for metallic SWNTs (38), this technique may enable SWNTs to be used as conductive interconnects in electronics. In another example, individual and bundled SWNTs were linked to follow an MHA path defined by DPN printing, exhibiting extensive flexibility that is favorable for making electronic interconnects (FIG. 4c and also see FIG. 12).

Figure 5:
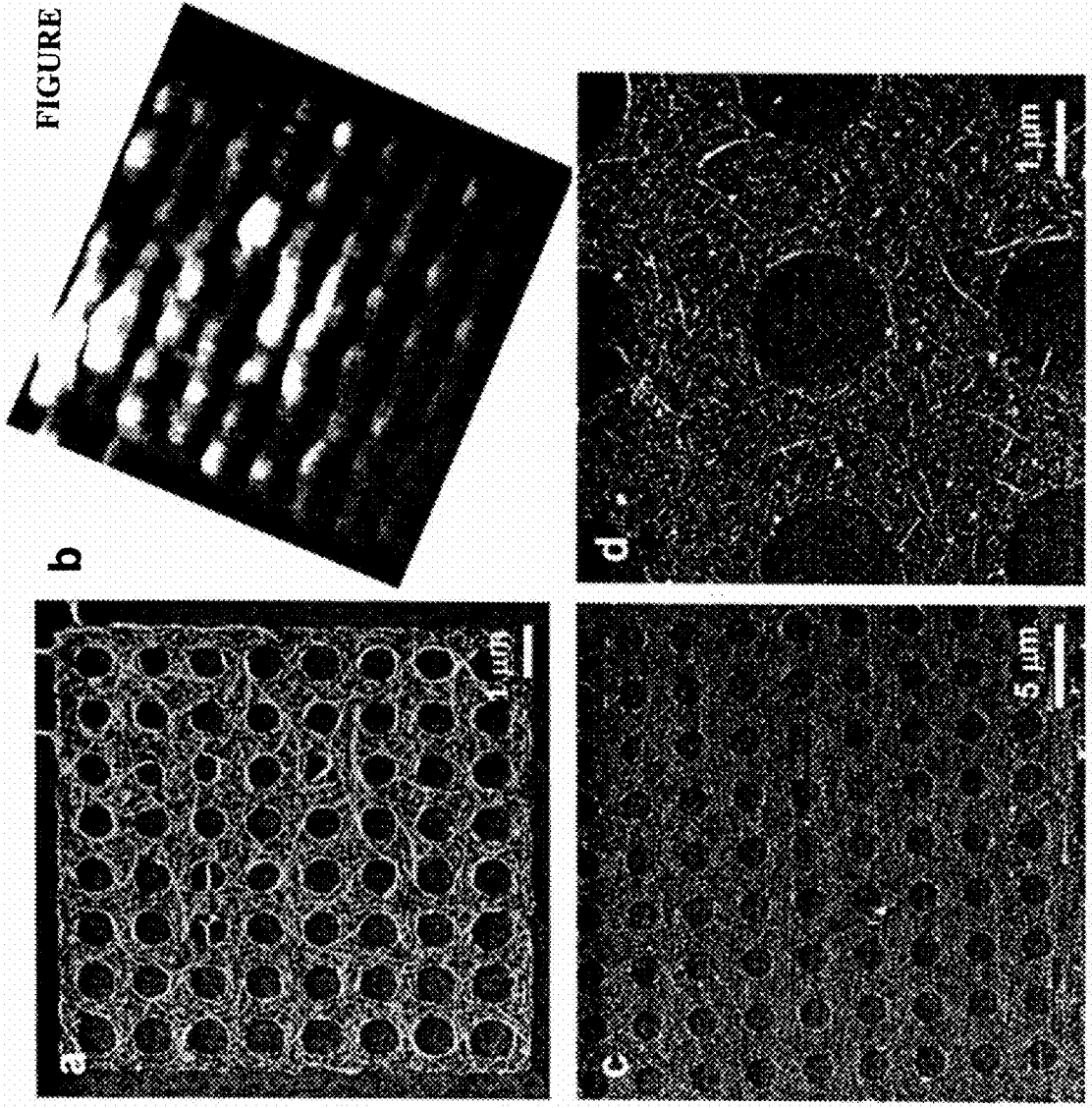
FIG. 5 shows SWNT filtration membranes. (a) AFM topographic image of a SWNT membrane with 600±50-nm diameter pores spanning an area of 10×10 microns. (b) corresponding Raman image showing SWNT spectroscopic signatures. The false color topography represents the integrated Raman intensity over 1.320-1,620 $cm^{-1}$. (c and d) Representative AFM topographic images of a SWNT network with 1.6±0.1 micron-diameter pores spanning an area of 1×2 cm. All AFM images were recorded at a scan rate of 0.5 Hz, and the height scales are 20 nm.

The ability to control the shape of SWNTs allows one to engineer their band gaps by building in strain (39) but, most importantly, this assembly method provides those skilled in the art with a tool to organize SWNTs into desirable architectures for a variety of potential applications. For example, this approach provides a simple route toward creating thin structured SWNT films that are currently unattainable. FIG. 5a demonstrates a SWNT filtration membrane with a thickness of only 9±2 nm. The SWNT composition has been characterized and mapped with a Raman confocal microscope (FIG. 5b). These membranes can be made uniformly over 1×2 cm by µCP (FIG. 5c and d), and their sizes appear to be limited only by the area and patterned structures defined by available lithography techniques. The thickness of these membranes can be controlled down to about 5 nm to about 10 nm, thereby promising an ultra-high flux in filtration (40) and structured, transparent conductors potentially useful in flexible displays (8, 41).

In conclusion, the working examples have demonstrated the ability to position, shape, and link µm-long SWNTs by using the boundaries between COOH- and CH$_3$-SAMs as affinity templates. Experiments and molecular simulations show excellent control down to sub-100-nm dimensions. Further control can be carried out by fine-tuning the intertube interactions (42) and coupling to other alignment techniques such as Langmuir-Blodgett methods (13) or microfluidics (43). Because there is no specific chemical bonding required, this technique can be effective for the directed assembly of other nanoscale building blocks such as nanowires and nanoparticles.

Materials and Methods

Materials. MHA (90%), ODT (98%), MUO (97%), 1,2-dichlorobenzene (99%), and ethanol (200 proof, HPLC grade) were purchased from Sigma-Aldrich. AUT (99%) was purchased from Dojindo Laboratories, Kumamoto, Japan. Ti (99.7%) and Au (99.99%) wires were purchased from Alfa Aesar, Ward Hill, Mass. PEG-SM was prepared as described (44).

SWNT Functionalization and Solution Preparation. Purified HiPco materials (45), with an iron impurity <1.4 wt %, were dispersed in 1,2-dichlorobenzene by mild sonication using a bath sonicator (Branson model 2510) for 3 min. The resulting dispersion was then centrifuged at 50,000×g for 10 min, and the supernatant was sonicated for 3 min. This process was repeated twice, resulting in a solution containing a high percentage of individual/small bundles of SWNTs. To minimize SWNT aggregation in solution, low concentrations (5-20 mg/liter) were used. Further improvement in solution uniformity was achieved by sidewall functionalization of SWNTs with dodecyl groups (37).

DPN Printing. DPN printing (28, 29) experiments were performed with an atomic force microscope (CP-III, Veeco/Thermomicroscopes, Sunnyvale, Calif.) equipped with a 100 µm scanner and closed-loop scan control and commercial lithography software (DPNWRITE, DPN System-1, NanoInk, Chicago). Gold-coated commercial AFM cantilevers (sharpened, Si$_3$N$_4$, type A, NanoInk) with a spring constant of 0.05 N/m were used for patterning and subsequent imaging. All DPN patterning experiments were carried out under ambient conditions (≈30% relative humidity, 20-24° C.). Tips were soaked in an ink solution (e.g., saturated solution of MHA in acetonitrile) for 20s, and then blown dry with N$_2$. MHA features were generated on a gold thin film by traversing the tip over the surface in the form of the desired pattern. Polycrystalline Au films were prepared by thermal evaporation of 10 nm of Ti on SiO$_x$ followed by 30 nm of Au at a rate of 1 Å/s and a base pressure ≦1×10$^{-6}$ Torr.

µCP. Stamps were fabricated in a similar process as described (30). The stamp was "inked" with 5 mM total alkanethiol solution by gently spreading a drop on the surface of the stamp with a Q-tip. After the stamp was dry, patterned structures were generated on the surface by bringing the stamp (by hand) into contact with a clean Au thin film for 10 s. Then, the substrate was rinsed with ethanol and dried with N$_2$. The regions surrounding the molecular features patterned by DPN or µCP were passivated with a monolayer of alkanethiol molecules (e.g., ODT) by immersing the substrate in a 1-mM ethanol solution for 10 min followed by copious rinsing with ethanol and water (Barnstead Nanopure Water Purification System), alternatively. Finally, the substrate was dried with N$_2$.

Monolayer Formation. SAMs of alkanethiol molecules were prepared on Au thin films by immersing the substrate in a 1-mM ethanol solution of the corresponding molecules for 1 h, followed by rinsing with ethanol and drying with N$_2$. Static contact angles were measured by using the half-angle technique (Tantec, Schaumberg, Ill.).

SWNT Deposition. To a DPN-patterned, µCP-patterned, or monolayer-based substrate was added a drop of I,2-dichlorobenzene containing 5-20 mg/liter of SWNTs. The substrate was then tilted back and forth 5-10° to allow the drop to slowly roll through the patterned area five times. Subsequently, the substrate was rinsed gently with clean i,2-dichlorohenzene to minimize nonspecific binding, and then let to dry in air.

AFM and Raman Characterization. Tapping mode AFM images were taken with a NanoMan AFM system (Dimension 3100, Veeco Instruments, Woodbury, N.Y.). Raman images were obtained with a confocal Raman microscope (WiTec Instruments, Ulm, Germany) with a 633-nm excitation line.

Monte Carlo Simulations. In the Monte Carlo calculations, it was considered only the first three carbon groups in the molecular SAMs; that is, CH$_3$CH$_2$COOH and CH$_3$CH$_2$CH$_3$ were used to represent MHA and ODT, respectively. This simplification is reasonable because the rest of the alkyl chain is buried, making negligible contributions to the van der Waals interactions between the —CH$_3$ group and the SWNT. Each SAM was constructed from an ensemble of 961 molecules in a hexagonal array, resulting in an overall simulation area of 13×11 nm. The optimized geometries of these molecular SAMs give an averaged intermolecular distance of 5.0 and 4.5 Å for the COOH- and CH$_3$-SAMs, respectively. These values are in good agreement with experimental values (46, 47). The optimized geometries of these molecular SAMs and a 10-nm-long [9,6] SWNT, made of 1,221 carbon atoms, were used to calculate their interaction energies. To model the interaction between the nanotube and the solvent in a way that is consistent with the SAM/SWNT interaction, a 13-nm droplet, consisting of 9,948 1,2-dichlorobenzene molecules, is first optimized and sliced in half. This process creates a flat surface comparable in size to the surface of the SAM. The SWNT is then put on this surface and the energy is minimized with the constraint that the SAMs, the solvent surface, and the nanotube are treated as rigid, i.e., the nanotube is only allowed to translate and rotate. The resulting interaction energy between nanotube and solvent can thereby be compared with those obtained with that between the nanotube and the SAM. Of course, the total interaction between the nanotube and its surroundings should also include the interaction between the solvent and the exposed part of the SWNT. This nanotube/exposed solvent interaction energy would be the same for all three surfaces and would require significantly higher computational effort to include, so it has been omitted from the Monte Carlo simulations.

LISTING OF REFERENCES

All references cited herein are hereby incorporated by reference in their entirety.
1. Baughman, R. H., Zakhidov, A. A. & de Heer, W. A. (2002) *Science* 297, 787-92.
2. Avouris, Ph. (2002) *Acc. Chem. Res.* 35, 1026-1034.
3. Kong, J., Franklin, N. R., Zhou, C., Chapline, M. G., Peng, S., Cho, K. & Dailt, H. (2000) *Science* 287, 622-625.
4. Postma, H. W., Teepen, T., Yao, Z., Grifoni, M. & Dekker, C. (2001) *Science* 293, 76-9.
5. Rueckes, T., Kim, K., Joselevich, E., Tseng, G. Y., Cheung, C.-L. & Lieber, C. M. (2000) *Science* 289, 94-97.
6. Snow, E. S., Perkins, F. K., Houser, E. J., Badescu, S. C. & Reinecke, T. L. (2005) *Science* 307, 1942-5.
7. Lee, N. S., Chung, D. S., Han, I. T., Kang, J. H., Choi, Y. S., Kim, H. Y., Park, S. H., Jin, Y. W., Yi, W. K., Yun, M. J., Jung, J. E., Lee, C. J., You, J. H., Jo, S. H., Lee, C. G. & Kim, J. M. (2001) *Diamond & Related Materials* 10, 265-270.
8. Wu, Z., Chen, Z., Du, X., Logan, J. M., Sippel, J., Nikolou, M., Kamaras, K., Reynolds, J. R., Tanner, D. B., Hebard, A. F. & Rinzler, A. G. (2004) *Science* 305, 1273-1277.
9. Lay, M. D., Novak, J. P. & Snow, E. S. (2004) *Nano Lett.* 4, 603-606.
10. Yu, M., Dyer, M. J., Skidmore, G. D., Rohrs, H. W., Lu, X., Ausman, K. D., Von Ehr, J. R. & Ruoff, R. S. (1999) *Nanotechnology* 10, 244-252.
11. Falvo, M. R., Clary, G. J., Taylor, R. M., II, Chi, V., Brooks, F. P., Jr., Washburn, S. & Superfine, R. (1997) *Nature* 389, 581-584.
12. Duan, X., Zhang, J., Ling, X. & Liu, Z. (2005) *J. Am. Chem. Soc.* 127, 8268-8269.
13. Kim, Y., Minami, N., Zhu, W., Kazaoui, S., Azumi, R. & Matsumoto, M. (2003) *Jap. J. Appl. Phys. Part 1* 42, 7629-7634.
14. Walters, D. A., Casavant, M. J., Qin, X. C., Huffman, C. B., Boul, P. J., Ericson, L. M., Haroz, E. H., O'Connell, M. J., Smith, K., Colbert, D. T. & Smalley, R. E. (2001) *Chem. Phys. Lett.* 338, 14-20.
15. Xin, H. & Woolley, A. T. (2004) *Nano Lett.* 4, 1481-1484.
16. Kocabas, C., Meitl, M. A., Gaur, A., Shim, M. & Rogers, J. A. (2004) *Nano Lett.* 4, 2421-2426.
17. Martel, R., Shea, H. R. & Avouris, P. (1999) *Nature* 398, 299.
18. Sano, M., Kamino, A., Okamura, J. & Shinkai, S. (2001) *Science* 293, 1299-1301.
19. Collins, P. G., Arnold, M. S. & Avouris, P. (2001) *Science* 292, 706-709.
20. Gao, J., Yu, A., Itkis, M. E., Bekyarova, E., Zhao, B., Niyogi, S. & Haddon, R. C. (2004) *J. Am. Chem. Soc.* 126, 16698-16699.
21. Meitl, M. A., Zhou, Y., Gaur, A., Jeon, S., Usrey, M. L., Strano, M. S. & Rogers, J. A. (2004) *Nano Lett.* 4, 1643-1647.
22. Xin, H. & Woolley, A. T. (2003) *J. Am. Chem. Soc.* 125, 8710-8711.
23. Keren, K., Berman, R. S., Buchstab, E., Sivan, U. & Braun, E. (2003) *Science* 302, 1380-1382.
24. Liu, J., Casavant, M. J., Cox, M., Walters, D. A., Boul, P., Lu, W., Rimberg, A. J., Smith, K. A., Colbert, D. T. & Smalley, R. E. (1999) *Chem. Phys. Lett.* 303, 125-129.
25. Rao, S. G., Huang, L., Setyawan, W. & Hong, S. (2003) *Nature* 425, 36-37.
26. Tsukruk Vladimir, V., Ko, H. & Peleshanko, S. (2004) *Phys. Rev. Lett.* 92, 065502.
27. Auvray, S., Derycke, V., Goffman, M., Filoramo, A., Jost, O. & Bourgoin, J.-P. (2005) *Nano Lett.* 5, 451-455.
28. Piner, R. D., Zhu, J., Xu, F., Hong, S. & Mirkin, C. A. (1999) *Science* 283, 661-663.
29. Ginger, D. S., Zhang, H. & Mirkin, C. A. (2004) *Angew. Chem. Int. Ed.* 43, 30-35.
30. Gates, B. D., Xu, Q., Stewart, M., Ryan, D., Willson, C. G. & Whitesides, G. M. (2005) *Chem. Rev.* 105, 1171-1196.
31. Salaita, K., Lee, S. W., Wang, X., Huang, L., Dellinger, T. M., Liu, C. & Mirkin, C. A. (2005) *Small* 1, 940-945.
32. Liu, J., Dai, H., Hafner, J. H., Colbert, D. T., Smalley, R. E., Tans, S. J. & Dekker, C. (1997) *Nature* 385, 780-781.
33. Shea, H. R., Martel, R. & Avouris, P. (2000) *Phys. Rev. Lett.* 84, 4441-4444.
34. Tamura, R., Ikuta, M., Hirahara, T. & Tsukada, M. (2005) *Phys. Rev.* 871, 0454181-0454187.
35. Cornell, W. D., Cieplak, P., Bayly, C. I., Gould, I. R., Merz, K. M., Jr., Ferguson, D. M., Spellmeyer, D. C., Fox, T., Caldwell, J. W. & Kollman, P. A. (1995) *J. Am. Chem. Soc,* 117, 5179-97.
36. Javey, A., Qi, P., Wang, Q. & Dai, H. (2004) *Proc. Nat. Acad. Sci. U.S.A.* 101, 13408-13410.
37. Liang, F., Sadana, A. K., Peera, A., Chattopadhyay, J., Gu, Z., Hauge, R. H. & Billups, W. E. (2004) *Nano Lett.* 4, 1257-1260.
38. Yao, Z., Kane, C. L. & Dekker, C. (2000) *Phys. Rev. Lett.* 84, 2941-2944.
39. Minot, E. D., Yaish, Y., Sazonova, V., Park, J.-Y., Brink, M. & McEuen, P. L. (2003) *Phys. Rev. Lett.* 90, 156401-156404.
40. Hong, J.-M., Anderson, P. E., Qian, J. & Martin, C. R. (1998) *Chem. Mater.* 10, 1029-1033.
41. Ko, H., Jiang, C., Shulha, H. & Tsukruk, V. V. (2005) *Chem. Mater.* 17, 2490-2493.
42. Shvartzman-Cohen, R., Nativ-Roth, E., Baskaran, E., Levi-Kalisman, Y., Szleifer, I. & Yerushalmi-Rozen, R. (2004) *J. Am. Chem. Soc.* 126, 14850-14857.
43. Huang, Y., Duan, X., Wei, Q. & Lieber, C. M. (2001) *Science* 291, 630-3.
44. Pale-Grosdemange, C., Simon, E. S., Prime, K. L. & Whitesides, G. M. (1991) *J. Am. Chem. Soc.* 113, 12-20.
45. Xu, Y.-Q., Peng, H., Hauge, R. H. & Smalley, R. E. (2005) *Nano Lett.* 5, 163-168.
46. Larsen, N. B., Biebuyck, H., Delamarche, E. & Michel, B. (1997) *J. Am. Chem. Soc.* 119, 3017-3026.
47. Hong, S., Zhu, J. & Mirkin, C. A. (1999) *Langmuir* 15, 7897-7900.

What is claimed is:
1. An article comprising:
a solid surface comprising at least two different surface regions including:

a first surface region which comprises an outer boundary and which is adapted for carbon nanotube adsorption, and a second surface region which is adapted for preventing carbon nanotube adsorption, the second region forming an interface between the outer boundary of the first region and the boundary of the second region, at least one carbon nanotube sufficiently longer than the size and shape of the first surface region so that at least 10% of the length of the at least one carbon nanotube is selectively adsorbed at the interface and the at least one carbon nanotube bends along the perimeter of the first surface region.

2. The article according to claim 1, wherein the first region comprises hydrophilic groups.

3. The article according to claim 1, wherein the first region comprises carboxyl groups.

4. The article according to claim 1, wherein the second region comprises hydrophobic groups.

5. The article according to claim 1, wherein the second region comprises alkyl groups.

6. The article according to claim 1, wherein the first surface region comprises a dot, a ring, a line, or a curvilinear structure.

7. The article according to claim 1, comprising a plurality of first surface regions which form a periodic array.

8. The article according to claim 1, wherein the carbon nanotube is a multi-walled, a double-walled, or a single wall carbon nanotube.

9. The article according to claim 1, wherein a plurality of carbon nanotubes are adsorbed which have an average length of at least 0.4 microns.

10. The article according to claim 1, wherein carbon nanotube has a length of about 10 nm to about 50 nm.

11. The article according to claim 1, wherein the first region forms a dot having a dot diameter, a ring having a ring diameter, and the nanotube has a length which is longer than the diameter.

12. The article according to claim 1, wherein the carbon nanotube is a single wall carbon nanotube, and wherein a plurality of carbon nanotubes are selectively adsorbed at the interface and are linked together.

13. An article comprising:
a solid surface comprising at least two different surface regions including:
a first surface region which comprises an outer boundary and which is adapted for nanowire adsorption, and
a second surface region which is adapted for preventing nanowire adsorption, the second region forming an interface between the outer boundary of the first region and the boundary of the second region,
at least one nanowire which is sufficiently longer than the size and shape of the first surface region so that at least 10% of the length of the at least one nanowire is selectively adsorbed at the interface and the at least one nanowire bends along the perimeter of the first surface region.

14. The article according to claim 13, wherein the outer boundary is circular.

15. The article according to claim 13, wherein the nanowire forms a ring.

16. The article according to claim 13, wherein the nanowire is a silicon nanowire.

17. The article according to claim 13, wherein the article is a thin film having a film height of about 10 nm or less.

18. The article according to claim 13, wherein the article is a filtration membrane.

19. The article according to claim 13, wherein the first region or the second region have a lateral dimension which is about 100 nm or less.

20. The article according to claim 13, wherein the article provides a nanowire packing density of at least $5 \times 10^7 / cm^2$.

* * * * *